(12) United States Patent
Uchida et al.

(10) Patent No.: US 10,431,634 B2
(45) Date of Patent: Oct. 1, 2019

(54) ORGANIC ELECTROLUMINESCENCE DEVICE WITH RECESSES FILLED WITH A PHOSPHOR FILLING LAYER IN THE BASE MATERIAL

(71) Applicant: Sharp Kabushiki Kaisha, Sakai, Osaka (JP)

(72) Inventors: Hideki Uchida, Sakai (JP); Katsuhiro Kikuchi, Sakai (JP); Yoshiyuki Isomura, Sakai (JP); Masanori Ohara, Sakai (JP); Satoshi Inoue, Sakai (JP); Eiji Koike, Sakai (JP); Yuto Tsukamoto, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/758,735

(22) PCT Filed: Aug. 10, 2016

(86) PCT No.: PCT/JP2016/073561
§ 371 (c)(1),
(2) Date: Mar. 9, 2018

(87) PCT Pub. No.: WO2017/043245
PCT Pub. Date: Mar. 16, 2017

(65) Prior Publication Data
US 2019/0067379 A1    Feb. 28, 2019

(30) Foreign Application Priority Data

Sep. 10, 2015    (JP) ................................ 2015-178339

(51) Int. Cl.
*H01L 29/08*    (2006.01)
*H01L 33/00*    (2010.01)
(Continued)

(52) U.S. Cl.
CPC .............. *H01L 27/322* (2013.01); *G02B 5/20* (2013.01); *H01L 51/5206* (2013.01);
(Continued)

(58) Field of Classification Search
CPC ............... H01L 27/322; H01L 51/5206; H01L 51/5221; H01L 51/5271; H01L 51/56
See application file for complete search history.

(56) References Cited

U.S. PATENT DOCUMENTS

2010/0164364 A1    7/2010  Eida et al.
2013/0056788 A1*   3/2013  Haraguchi ............ H01L 33/486
                                                        257/99
(Continued)

FOREIGN PATENT DOCUMENTS

CN      101455122 A    6/2009
JP         4074099 B2   4/2008
JP      2011-228229 A  11/2011

*Primary Examiner* — Alonzo Chambliss
(74) *Attorney, Agent, or Firm* — Keating & Bennett, LLP

(57) ABSTRACT

An organic electroluminescence device includes a base material including a recessed portion on a surface side, a reflective layer disposed at least on a surface of the recessed portion, a filling layer having optical transparency, the filling layer being disposed in the recessed portion through the reflective layer, a first electrode having optical transparency, the first electrode being disposed at least on an upper-layer side of the filling layer, an organic layer including at least a light emitting layer, the organic layer being disposed on an upper-layer side of the first electrode, and a second electrode having optical transparency and light reflectivity, the second electrode being disposed on an upper-layer side of the organic layer. The filling layer includes at least one type of phosphor.

20 Claims, 23 Drawing Sheets

(51) Int. Cl.
*H01L 31/0232* (2014.01)
*H01L 21/00* (2006.01)
*H01L 51/40* (2006.01)
*H01L 27/32* (2006.01)
*G02B 5/20* (2006.01)
*H01L 51/52* (2006.01)
*H01L 51/56* (2006.01)

(52) U.S. Cl.
CPC ...... *H01L 51/5221* (2013.01); *H01L 51/5271* (2013.01); *H01L 51/56* (2013.01); *H01L 27/3211* (2013.01); *H01L 51/5284* (2013.01); *H01L 2251/5361* (2013.01); *H01L 2251/5369* (2013.01); *H01L 2251/558* (2013.01)

(56) References Cited

U.S. PATENT DOCUMENTS

| | | | | |
|---|---|---|---|---|
| 2014/0264419 A1* | 9/2014 | Kim | ...................... | H01L 33/504 257/98 |
| 2015/0340574 A1* | 11/2015 | Tamaki | ................. | H01L 33/505 257/98 |
| 2018/0269428 A1* | 9/2018 | Uchida | .................... | G02B 5/20 |
| 2018/0287099 A1* | 10/2018 | Uchida | .................... | G02B 5/20 |

* cited by examiner

|  |  |  | MIXING RATIO (MOLAR RATIO) | | | |
|---|---|---|---|---|---|---|
|  |  | BINDER | BLUE PHOSPHOR a | GREEN PHOSPHOR b | ORANGE PHOSPHOR c | RED PHOSPHOR d |
| EXAMPLE 1 | FILLING LAYER A | 97% | 3% |  |  |  |
| EXAMPLE 2 | FILLING LAYER B | 92% | 5% | 3% |  |  |
| EXAMPLE 3 | FILLING LAYER C | 87% | 5% | 5% | 3% |  |
| EXAMPLE 4 | FILLING LAYER D | 87% | 5% | 3% | 3% | 2% |

FIG. 14

| | x | y |
|---|---|---|
| R | 0.643757 | 0.350222 |
| G | 0.281121 | 0.631762 |
| B | 0.160232 | 0.0526 |

ORGANIC ELECTROLUMINESCENCE DEVICE WITH RECESSES FILLED WITH A PHOSPHOR FILLING LAYER IN THE BASE MATERIAL

TECHNICAL FIELD

The disclosure relates to an organic electroluminescence device, a method of manufacturing organic electroluminescence device, an illumination device, and a display device.

This application claims priority from Japanese Patent Application No. 2015-178339, filed on Sep. 10, 2015, the entirety of which is incorporated by reference herein.

BACKGROUND ART

Development of an organic EL display as a candidate of next generation display techniques has progressed. Electroluminescence is shortened to "EL" hereafter. The organic EL display is a self light emitting element and has a structure that is simpler than a liquid crystal display including a white backlight, a liquid crystal substrate (TFT substrate), and a color filter substrate. For this reason, a thin and light flexible display is expected to be produced at low cost in future.

Unfortunately, the organic EL display has the following objectives to be attained.

A. The organic EL display is difficult to achieve high definition.

Currently, in liquid crystal display, displays with a pixel density exceeding 500 ppi have been proposed.

On the other hand, in organic EL display, separate coating is carried out by using a mask vapor deposition method in which a perforated mask having openings is used in order to coat the light emitting layer separately for each RGB, and in the coating process, the pixel density is limited to approximately 350 ppi. In addition, although an inkjet method, a printing method and the like have been proposed, a resolution exceeding 200 ppi is difficult to achieve.

For this reason, in order to obtain a high-definition organic EL display, the "white color conversion scheme" has been proposed in which the emission color is made white and then colorized by being passed through a color filter.

With this scheme, a high definition can be achieved because the light emitting layer is not separately coated. However, the structure comes close to that of the liquid crystal display due to the use of the color filter substrate, and thus, the superiority of the organic EL display as described above cannot be exerted.

B. The light emitting component being a light emitting element exhibits low extraction efficiency.

In the light emitting element, basically, the light emitting component emits uniformly in all directions. Accordingly, a part of the light emitting component emitted in the light emitting layer is totally reflected due to the difference in the refractive indices between the light emitting layer and the air, and is therefore guided only inside the element, not extracted to the outside. For example, when the refractive index of the light emitting layer is 1.8, approximately 20% of the light emitting component is extracted upward and downward, and approximately 80% of the rest is sealed in the light emitting layer. As described above, a known organic EL device has a problem of low light utilization efficiency.

In contrast thereto, in PTL 1, the light extraction efficiency is enhanced by curving the traveling direction of the light emitting component being guided.

CITATION LIST

Patent Literature

PTL 1: JP 4074099 B

SUMMARY

Technical Problem

Unfortunately, although the light utilization efficiency can be enhanced in PTL 1, high definition is difficult to achieve. A procedure capable of simultaneously solving the above objects A and B has not yet been accomplished.

An aspect of the disclosure has been made to achieve the above objects, and aims to provide, as one purpose, an organic EL device having high light utilization efficiency and a high definition, a method of manufacturing the organic EL device, an illumination device, and a display device.

Solution to Problem

An organic EL device according to one aspect of the disclosure includes a base material including a recessed portion on a surface side, a reflective layer, a filling layer having optical transparency, a first electrode having optical transparency, an organic layer including at least a light emitting layer, and a second electrode having optical transparency and light reflectivity. The reflective layer is disposed at least on a surface of the recessed portion. The filling layer is disposed in the recessed portion through the reflective layer. The first electrode is disposed at least on an upper-layer side of the filling layer. The organic layer is disposed on an upper-layer side of the first electrode. The second electrode is disposed on an upper-layer side of the organic layer. The filling layer includes at least one type of phosphor.

In an organic EL device according to one aspect of the disclosure, the filling layer may include at least two different types of the phosphor.

In an organic EL device according to one aspect of the disclosure, a portion of the reflective layer may be in contact with a portion of the first electrode.

In an organic EL device according to one aspect of the disclosure, a lower face of the first electrode at a position inside the recessed portion is positioned lower than a plane including the surface side of the base material.

In an organic EL device according to one aspect of the disclosure, the fluorescent wavelength of at least one of the phosphors included in the filling layer may differ from the light emission wavelength of the light emitting material included in the light emitting layer.

In an organic EL device according to one aspect of the disclosure, the fluorescent wavelength of at least one of the phosphors included in the filling layer may be longer than a light emission wavelength of the light emitting material included in the light emitting layer.

In an organic EL device according to one aspect of the disclosure, the filling layer may include a plurality of the phosphors having different fluorescent wavelengths.

In an organic EL device according to one aspect of the disclosure, the fluorescent wavelength of at least one of the phosphors included in the filling layer may be in an ultraviolet region.

In an organic EL device according to one aspect of the disclosure, the phosphor may include an organic material.

In an organic EL device according to one aspect of the disclosure, the organic EL device may include an ultraviolet absorbing layer on an upper face of the light emitting layer.

In an organic EL device according to one aspect of the disclosure, at least one of the phosphors included in the filling layer may include an inorganic material.

In an organic EL device according to one aspect of the disclosure, at least one of the phosphors included in the filling layer may include a quantum dot.

In an organic EL device according to one aspect of the disclosure, the filling layer may include at least two types of filling layer including the mutually different types of the phosphor.

In an organic EL device according to one aspect of the disclosure, one pixel may include a first sub pixel including a first filling layer including the phosphor and a second sub pixel including a second filling layer not including the phosphor.

In an organic EL device according to one aspect of the disclosure, the organic EL device may include a light absorbing layer configured to absorb light of a specific wavelength on an upper face of the light emitting layer.

In an organic EL device according to one aspect of the disclosure, the absorption wavelength of the light absorbing layer may substantially coincide with the spectrum emitted from the light emitting layer.

A method of manufacturing an organic EL device according to one aspect of the disclosure includes: forming a recessed portion on one surface of a base material; forming a reflective layer at least along a surface of the recessed portion; forming a filling layer having optical transparency in the recessed portion through the reflective layer; forming a first electrode having optical transparency at least on a side of a layer on the filling layer; forming an organic layer including at least a light emitting layer on a side of a layer on the first electrode, the organic layer including at least light emitting layer; and forming a second electrode on a side of a layer on the organic layer, the second electrode having optical transparency and light reflectivity. At least one type of phosphor is used in the process of forming the filling layer.

An illumination device according to one aspect of the disclosure includes a base material including a recessed portion on a surface side, a reflective layer, a filling layer having optical transparency, a first electrode having optical transparency, an organic layer including at least a light emitting layer, and a second electrode having optical transparency and light reflectivity. The reflective layer is disposed at least on a surface of the recessed portion. The filling layer is disposed in the recessed portion through the reflective layer. The first electrode is disposed at least on an upper-layer side of the filling layer. The organic layer is disposed on an upper-layer side on the first electrode. The second electrode is disposed on an upper-layer side on the organic layer. The filling layer includes at least one type of phosphor.

A display device according to one aspect of the disclosure includes a base material including a recessed portion on a surface side, a reflective layer, a filling layer having optical transparency, a first electrode having optical transparency, an organic layer including at least a light emitting layer, and a second electrode having optical transparency and light reflectivity. The reflective layer is disposed at least on a surface of the recessed portion. The filling layer is disposed in the recessed portion through the reflective layer. The first electrode is disposed at least on an upper-layer side on the filling layer. The organic layer is disposed on an upper-layer side on the first electrode. The second electrode is disposed on an upper-layer side on the organic layer. The filling layer includes at least one type of phosphor.

Advantageous Effects of Disclosure

According to one aspect of the disclosure, an organic EL device having high light utilization efficiency and high definition can be obtained. According to one aspect of the disclosure, a method of manufacturing an organic EL device having high light utilization efficiency and high definition can be obtained. According to one aspect of the disclosure, an illumination device having high light utilization efficiency and high definition can be obtained. According to one aspect of the disclosure, a display device having high light utilization efficiency and high definition can be obtained.

BRIEF DESCRIPTION OF DRAWINGS

FIG. 13A is a graph illustrating a peak wavelength of an emission spectrum in a phosphor a.

FIG. 14 is a table listing the mixing ratio (molar ratio) of various types of phosphor constituting each filling layer in each of the organic EL devices of Examples 1 to 4.

DESCRIPTION OF EMBODIMENTS

First Embodiment

A description follows regarding a first embodiment of the disclosure, with reference to FIG. 1 to FIG. 15D.

The organic EL device of the first embodiment is an example of a top-emitting organic EL device using a microcavity structure.

Figure 1:
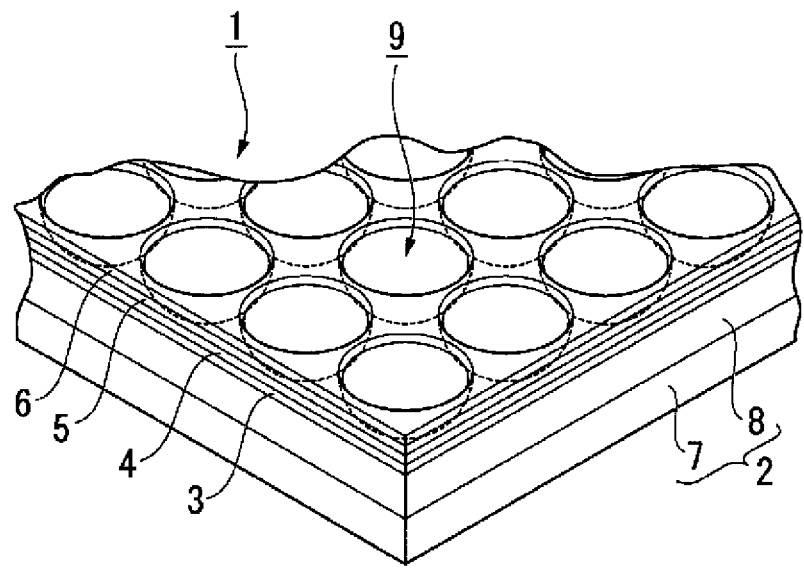
FIG. 1 is a perspective view illustrating an organic EL device according to the first embodiment.

FIG. 1 is a perspective view of an organic EL device of the first embodiment.

Note that in each of the drawings below, the dimensional scale is illustrated differently depending on the component, so that each component is easily visible.

As illustrated in FIG. 1, an organic EL device 1 of the present embodiment includes a base material 2, a reflective layer 3, a first electrode 4, an organic layer 5 including a light emitting layer, and a second electrode 6. The organic EL device 1 is a top-emitting organic EL device in which light emitted by the light-emitting layer is emitted from the second electrode 6 side. The base material 2 includes a substrate 7 and an underlayer 8. The underlayer 8, the reflective layer 3, the first electrode 4, the organic layer 5, and the second electrode 6 are layered onto the upper face of the substrate 7 in this order from the substrate 7 side. On the upper face which is a light emitting surface of the organic EL device 1, a plurality of recessed portions 9 are provided.

The organic EL device 1 includes a plurality of unit light emitting regions that are divided from each other. The plurality of unit light emitting regions include a red light emitting region that emits red light, a green light emitting region that emits green light, and a blue light emitting region that emits blue light. The red light emitting region, the green light emitting region, and the blue light emitting region differ only in the constituent material of the filling layer, and the other structures are common. Each of the organic EL device 1 can be used, for example, as an illumination device that simultaneously emits red light, green light, and blue light to produce white light.

However, applications of the organic EL device 1 are not limited to illumination devices. For example, the organic EL device 1 can be applied to a display device in which red light emitting region, green light emitting region, and blue light emitting region are used for a red sub pixel, a green sub pixel, and a blue sub pixel, respectively, and the three sub pixels form one pixel.

Figure 2:
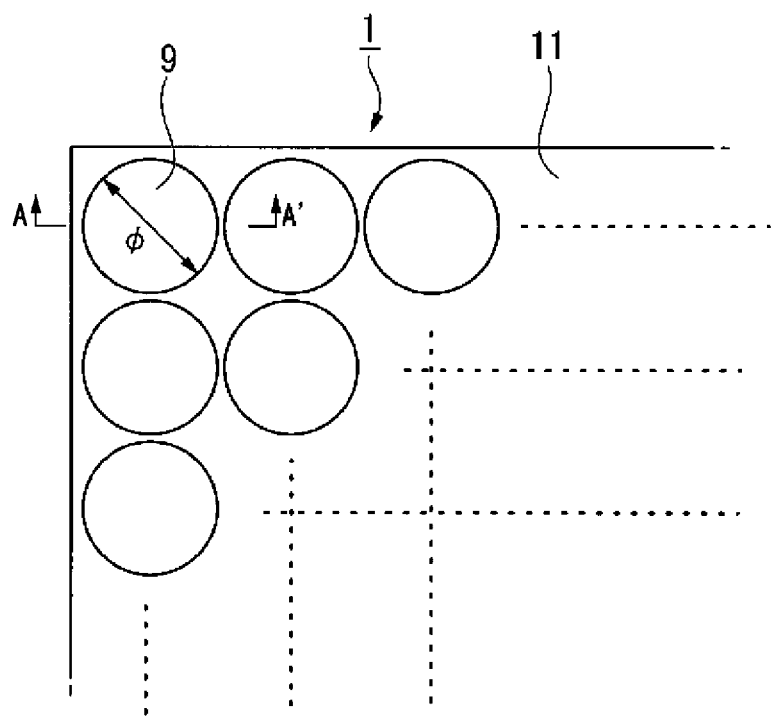
FIG. 2 is a plan view illustrating a part of the unit light emitting region 11 on a larger scale.

FIG. 2 is a plan view illustrating a part of a unit light emitting region 11 on a larger scale.

When viewed from the normal direction of the upper face of the organic EL device 1, the planar shape of the unit light emitting region 11 is a square, and the length of one side of the square is, for example, approximately 2 mm.

As illustrated in FIG. 2, the unit light emitting region 11 is provided with a plurality of recessed portions 9 each having circular planar shape. The diameter φ of the recessed portion 9 is, for example, approximately 5 μm. The plurality of recessed portions 9 are regularly disposed in vertical and horizontal directions and form a lattice shape. The density of the recessed portions 9 satisfies a ratio of the total area of the plurality of recessed portions 9 to the area of the unit light emitting region 11 of approximately 70%.

Figure 3:
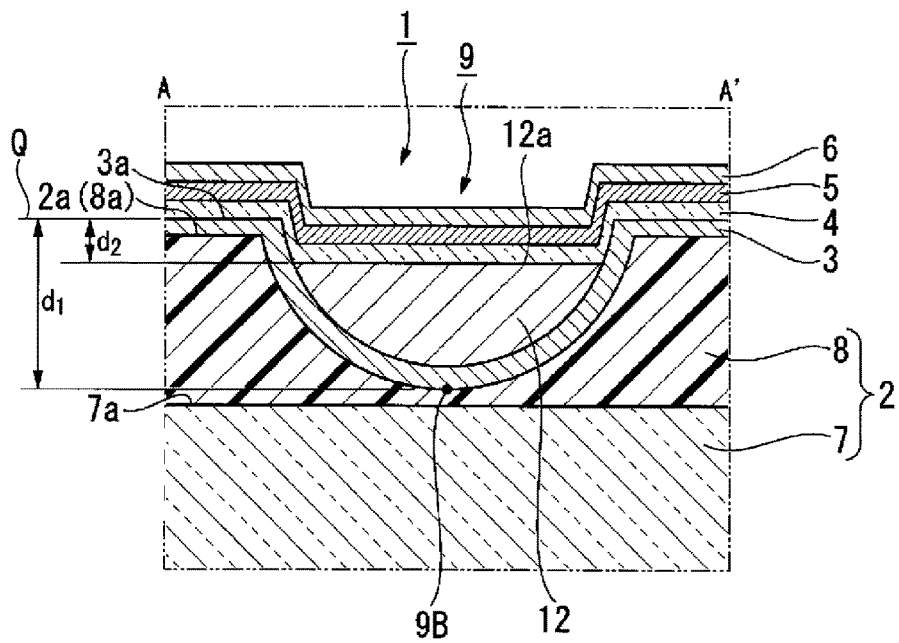
FIG. 3 is a cross-sectional view illustrating the organic EL device 1 sectioned along a plane orthogonal to an upper face of the base material 2.

FIG. 3 is a cross-sectional view illustrating the organic EL device 1 sectioned along a plane orthogonal to an upper face of the base material 2 and a cross-sectional view taken along line A-A' of FIG. 2.

As illustrated in FIG. 3, the underlayer 8 is layered on an upper face 7a of the substrate 7. For example, a glass substrate is employed for the substrate 7. Since the organic EL device 1 is a top-emitting organic EL device, the substrate 7 does not need to have optical transparency, and for example, a semiconductor substrate such as a silicon substrate may be employed.

The recessed portion 9 that opens toward the top is provided on an upper face 8a of the underlayer 8, in other words, on the upper face 2a of the base material 2. The cross-sectional shape of the recessed portion 9 is an arc shape. Specifically, an inner face of each of the recessed portions 9 three-dimensionally forms a portion of a spherical surface. The underlayer 8 is configured by a photosensitive resin, such as an acrylic, an epoxy, or a polyimide resin. Employing a photosensitive resin in the material of the underlayer 8 is well-suited to the method for forming the recessed portions 9, described later. However, when a method other than the forming method described later is applied, the material configuring the underlayer 8 need not be photosensitive.

Moreover, the material configuring the underlayer 8 need not be a resin, and an inorganic material may be employed. In the present embodiment, the base material 2 composed of the substrate 7 and the underlayer 8 is employed, the underlayer need not be employed and a recess may be formed in the substrate instead.

The reflective layer 3 is formed on the upper face 8a of the underlayer 8 including the inner surface of the recessed portion 9. A metal having high reflectance such as aluminum or silver is preferably used as a material constituting the reflective layer 3.

In the case of the present embodiment, the reflective layer 3 is formed from, for example, an aluminum film having a film thickness of 100 nm.

A filling layer 12 is filled into the inside of each of the recessed portions 9 with the reflective layer 3 interposed therebetween. An upper face 12a of the filling layer 12 is positioned lower than a plane Q including an upper face 3a of the reflective layer 3. A height from the upper face 12a of the filling layer 12 to the upper face 3a of the reflective layer 3 is d2. In the case of the present embodiment, the height d2 is set to, for example, 0.1 mm d1 is the height from a lowermost portion 9B of each of the recessed portions 9 to the upper face 3a of the reflective layer 3, which is the depth of the recessed portions 9. In the case of the present embodiment, the height d1 is set to, for example, 3 μm.

The upper face 12a of the filling layer 12 is preferably positioned lower than the plane Q including the upper face 3a of the reflective layer 3. However, even when the upper face 12a of the filling layer 12 is at the highest position, the position of the upper face 12a of the filling layer 12 need to be at the same height as the plane Q. In other words, the filling layer 12 is not formed to rise above the plane Q.

The filling layer 12 is formed from a resin material having optical transparency and a fluorescent material corresponding to each color.

More specifically, the resin material having a refractive index of 1.6 such as acrylic resin, epoxy resin, or polyimide resin is employed. In the present embodiment, an organic phosphor is used for the fluorescent material. A phosphor to emit red light is used in a red unit light emitting region 11R, a phosphor to emit green light is used in a green unit light emitting region 11G, and a phosphor to emit blue light is used in a blue unit light emitting region 11B.

The first electrode 4 is formed across the upper face 12a of the filling layer 12 and the upper face 3a of the reflective layer 3. The first electrode 4 is provided with a step in the edge portion of the recessed portion 9. A portion of the first electrode 4 positioned on the upper face 8a of the underlayer 8 is in contact with a portion of the reflective layer 3. The lower face of the first electrode 4 is in contact with the upper face 12a of the filling layer 12 at a position inside the recessed portion 9. Accordingly, the lower face of the first electrode 4 is positioned lower than the plane Q including the upper face 3a of the reflective layer 3. The first electrode 4 is a translucent electrode formed from a film stack of transparent conductive film such as indium tin oxide (ITO) or indium zinc oxide (IZO) and metal thin film, and has optical transparency and light reflectivity. In the case of the present embodiment, the first electrodes 4 are formed from, for example, ITO having a film thickness of 120 nm and a metal thin film such as Al, Ag and the like. Alternatively, the first electrode 4 may be composed only of a metal thin film. The first electrode 4 functions as an anode for injecting holes into the organic layer.

The organic layer 5 is layered across the upper face of the first electrode 4. The organic layer 5 is provided with a step in the edge portion of the recessed portion 9, reflecting the shape of the first electrode 4. The organic layer 5 is a layered body formed of an organic material. The organic layer 5 includes a hole injecting layer, a hole transport layer, a light emitting layer, an electron transport layer, and an electron injecting layer. The lower face of the organic layer 5 is positioned lower than the plane Q including the upper face 3a of the reflective layer 3. Detailed description of the configuration and function of each layer configuring the organic layer 5 is given later.

The second electrode 6 is layered along the upper face of the organic layer 5. The second electrode 6 is provided with a step in the edge portion of the recessed portion 9, reflecting the shape of the organic layer 5. The second electrode 6 is a translucent electrode made from a metal thin film such as silver, magnesium silver alloy and the like. In other words, the second electrode 6 has both optical transparency and light reflectivity, and transmits a part of the incident light and reflects the rest of the reflected light.

For the second electrode 6, metal having low work function is suitably used. For example, Ag, Al, magnesium alloy (MgAg and the like), aluminum alloy (AlLi, AlCa, AlMg and the like), and the like is employed. In the case of the present embodiment, the second electrode 6 is configured by, for example, a layered film of MgAg alloy having a film thickness of 1 nm and a film of Ag having a film thickness of 5 nm. The second electrode 6 functions as a cathode for injecting electrons into the organic layer 5.

In the present embodiment, a region from the first electrode 4 to the second electrode 6 forms a microcavity structure. Light emitted from the light emitting layer is multiply reflected between the first electrode 4 and the second electrode 6. At that time, a component with a specific wavelength of the light emitted from the light emitting layer is enhanced. Moreover, although omitted from the illustration in FIG. 3, an optical adjustment layer known as a cap layer is layered on the upper face of the second electrode 6.

Figure 4:
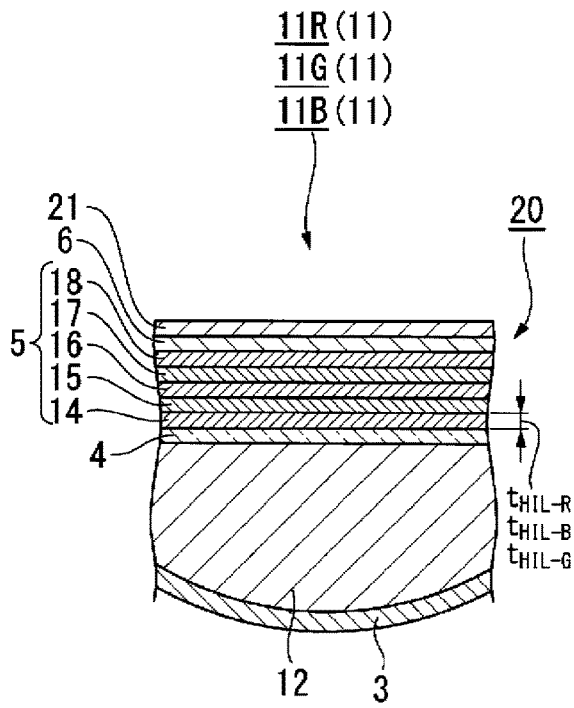
FIG. 4 is a cross-sectional view illustrating a detailed structure of each unit light emitting region 11 of each color.

FIG. 4 is a cross-sectional view illustrating a detailed structure of each unit light emitting region 11 of each color.

The three unit light emitting regions 11R, 11G, and 11B illustrated in FIG. 4 have a common basic configuration except that the film thicknesses of the hole injecting layers differs.

As illustrated in FIG. 4, the organic layer 5 is provided as a layer on the first electrode 4. The organic layer 5 includes a layered film including a hole injecting layer 14, a hole transport layer 15, a light emitting layer 16, an electron transport layer 17, and an electron injecting layer 18 layered from the first electrode 4 side. However, layers other than the light emitting layer 16 may be appropriately introduced as necessary. A single layer may serve as both a transport layer and an injecting layer.

In the present embodiment, as described above, an example is given of an organic layer having a 5-layer structure of the hole injecting layer 14, the hole transport layer 15, the light emitting layer 16, the electron transport layer 17, and the electron injecting layer 18. Moreover, as necessary, a layer for preventing migration of charge to the opposite side electrode, such as a hole blocking layer or an electron blocking layer, may be appropriately added.

The hole injecting layer 14 is a layer that functions to increase hole injection efficiency from the first electrode 4 to the light emitting layer 16. Examples that may be employed as the material for the hole injecting layer 14 include benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; and heterocyclic conjugated monomers, oligomers, polymers, and the like of an polysilane-based compound, a vinylcarbazole-based compound, a thiophene-based compound, and an aniline-based compound. Molybdenum oxide is blended with these organic materials. The blending ratio of the organic material and the molybdenum oxide is, for example, approximately 80% organic material, and approximately 20% molybdenum oxide.

The hole transport layer 15 is a layer that functions to increase the hole transport efficiency from the first electrode 4 to the light emitting layer 16. An organic material similar to the hole injecting layer 14 may be employed in the hole transport layer 15. Note that the hole injecting layer 14 and the hole transport layer 15 may be a single body, or may be formed as individual layers.

The light emitting layer 16 functions to emit light when energy is released by holes injected from the first electrode 4 side recombining with electrons injected from the second electrode 6 side. The material for the light emitting layer 16 includes, for example, a host material and a dopant material. The material for the light emitting layer 16 may also include an assist material. The host material is included at the highest ratio among the materials constituting the light emitting layer 16. For example, the blending ratio of the host material and the dopant material is approximately 90% host material and approximately 10% dopant material. The host material is easily film formed into the light emitting layer 16 and functions to maintain the film state of the light emitting layer 16. Accordingly, it is desirable that the host material is a stable compound that does not easily crystallize after film formation and does not easily undergo chemical change.

Moreover, when an electric field is applied between the first electrode 4 and the second electrode 6, the host material functions such that recombination of carriers occurs within the host molecules, and excitation energy is transferred to the dopant material, causing the dopant material to emit light. The thickness of the light emitting layer 16 is equal to each other in each unit light emitting region, for example, approximately 35 nm.

In regard with the material configuring the light emitting layer 16, an identical light emitting material that emits UV light or blue light is used in all the red unit light emitting region 11R, the green unit light emitting region 11G, and the blue unit light emitting region 11B. In the case of the present embodiment, a bipolar material is used for the host material and a phosphor is used for the dopant material in all the unit light emitting regions.

Figure 5:
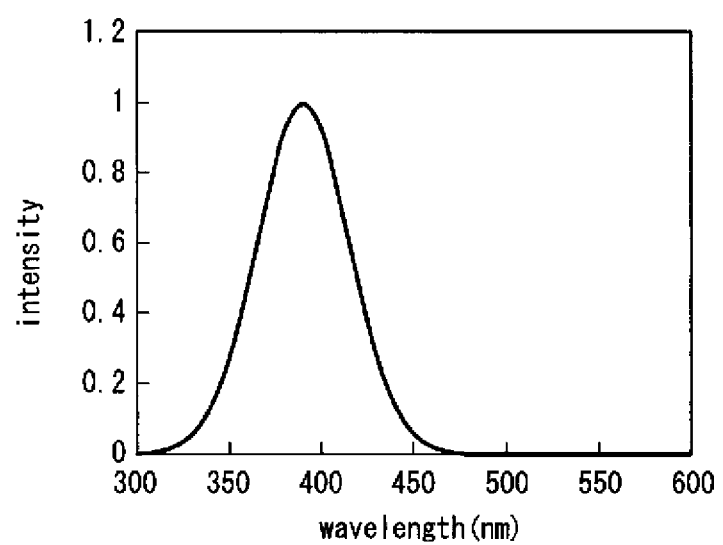
FIG. 5 is a graph illustrating an emission spectrum of a dopant material.

FIG. 5 is a graph illustrating an emission spectrum of a dopant material. As illustrated in FIG. 5, the dopant material preferably has a peak wavelength of the emission spectrum of 390 nm.

Specific examples of the material of the light emitting layer 16 include materials having a high light-emission efficiency, such as a low-molecular fluorescent colorant, a fluorescent macromolecule, and a metal complex. Examples of the material of the light emitting layer 16 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri(dibenzoylmethyl)phenanthroline europium complex; and ditoluylvinylbiphenyl.

The electron transport layer 17 functions to increase the electron transport efficiency from the second electrode 6 to the light emitting layer 16. As the material of the electron transport layer 17, for example, quinoline, perylene, phenanthroline, bisstyryl, pyrazine, triazole, oxazole, oxadiazole, fluorenone, or a derivative and a metal complex thereof can be employed. Specifically, tris(8-hydroxyquinoline)aluminum, anthracene, naphthalene, phenanthrene, pyrene, perylene, butadiene, coumarin, acridine, stilbene, 1,10-phenanthroline, and a derivative, or a metal complex thereof can be employed. The thickness of the electron transport layer 17 is, for example, approximately 15 nm.

The electron injecting layer 18 functions to increase the electron injection efficiency from the second electrode 6 to the light emitting layer 16. As the material of the electron injecting layer 18, for example, compounds such as calcium metal (Ca) or lithium fluoride (LiF) can be employed. Note that the electron transport layer 17 and the electron injecting layer 18 may be a single body, or may be formed as individual layers. The thickness of the electron injecting layer 18 is, for example, approximately 0.5 nm.

A microcavity structure 20 has an effect of enhancing light with a specific wavelength by using resonance of light generated between the first electrode 4 and the second electrode 6.

When the thickness of the hole injecting layer 14 of the red unit light emitting region 11R is tHIL-R, the thickness of the hole injecting layer 14 of the green unit light emitting region 11G is tHIL-G, and the thickness of the hole injecting layer 14 of the blue unit light emitting region 11B is tHIL-B, tHIL-R, tHIL-G, and tHIL-B are equal to one another.

Due to the microcavity structure 20, light emitted from the organic layer 5 is repeatedly reflected between the first electrode 4 and the second electrode 6 within a predetermined optical path length range, light with a specific wavelength corresponding to the optical path length is resonated and enhanced, and light with a wavelength that does not correspond to the optical path length is weakened. Accordingly, the spectrum of light extracted to the outside is made steep, the spectral intensity thereof is increased, and the brightness and color purity are improved.

A cap layer 21 is layered onto the upper face of the second electrode 6. The cap layer 21 functions as a protection layer for protecting the second electrode 6 and as an optical adjustment layer. Note that a color filter may be added on an upper-layer side of the second electrode 6. When the color filter transmits light emitted from the organic layer 5, the color purity can be enhanced.

A specific configuration example of the organic EL device 1 is given in Table 1.

TABLE 1

| | |
|---|---|
| ITO: 120 nm | ITO: 120 nm |
| HIL | 35 nm |
| Organic HTL material (80%):MoOx (20%) | |
| HTL Organic HTL material | 10 |
| EML | H (90%):d (10%) |
| H: Bipolar material | 35 nm |
| d: Fluorescent material | |
| ETL organic ETL material | 15 nm |
| EIL LiF | 0.5 nm |
| Cathode (translucent electrode) | MgAg 1 nm/Ag 5 nm |
| Cap layer | 78 nm |

Manufacturing Process of Organic EL Device

A description follows regarding a manufacturing process of the organic EL device 1 having the above configuration, with reference to FIGS. 6A to 9B.

FIGS. 6A to 6D are views illustrating a manufacturing process up to forming the reflective layer.

Figure 6A:
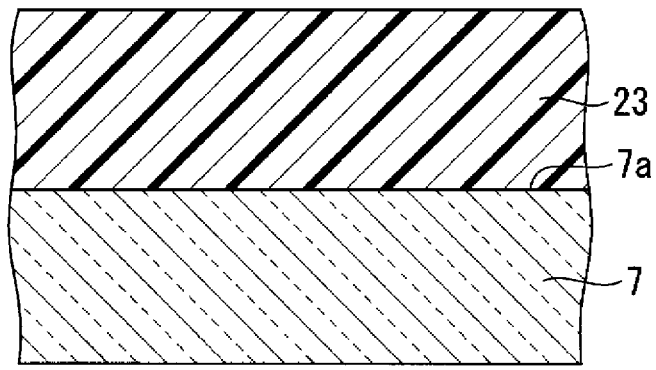
FIG. 6A is a first diagram illustrating a manufacturing process up to forming a reflective layer.

First, as illustrated in FIG. 6A, a positive-type photosensitive resin material is applied to the upper face 7a of the substrate 7 to form a resin layer 23.

Figure 6B:
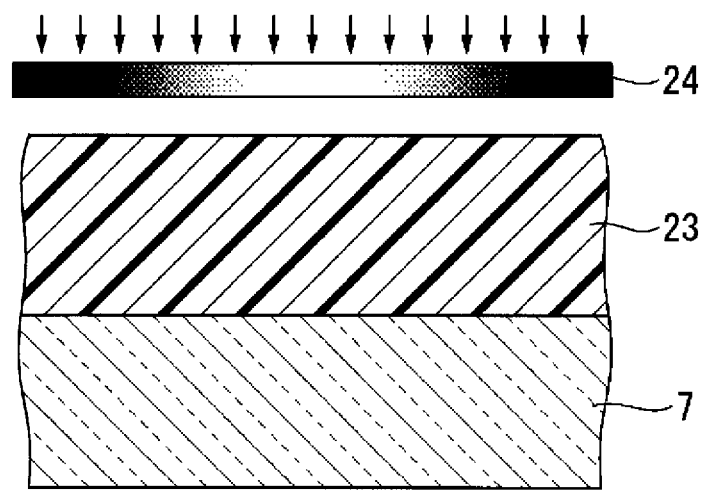
FIG. 6B is a second diagram illustrating a manufacturing process up to the forming a reflective layer.

Next, as illustrated in FIG. 6B, the resin layer 23 is exposed with a photomask 24.

At this time, the photomask 24 employed has a predetermined optical transparency distribution, like in a gray-tone mask. More specifically, the photomask 24 has high optical transparency near the center of a circular pattern, and the optical transparency decreases on progression toward peripheral portions. Thus, in the resin layer 23, the degree of exposure is high near the center of the circular pattern, and the degree of exposure decreases on progression toward the peripheral portions.

Figure 6C:
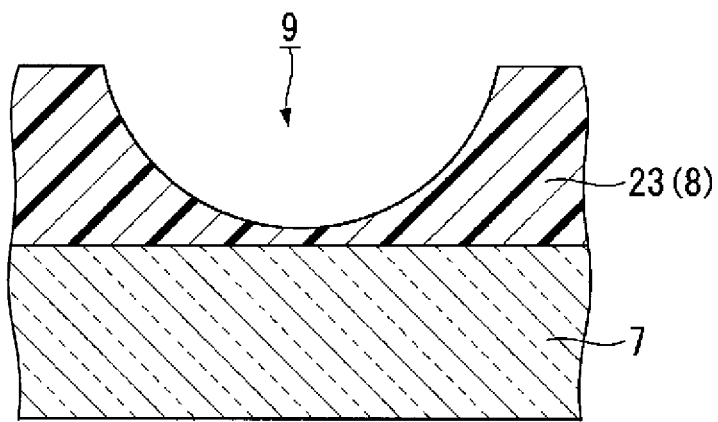
FIG. 6C is a third diagram illustrating a manufacturing process up to the forming a reflective layer.

Next, as illustrated in FIG. 6C, the resin layer 23 is developed using a predetermined developer. In accordance with the differences in the degree of exposure of the resin layer 23, the amount of film reduction of the resin layer 23 at this time is high near the center of a circular pattern, and decreases on progression toward the peripheral portions. The recessed portion 9 having circular arc cross-sectional profile is accordingly formed in the resin layer 23, to form the underlayer 8.

Figure 6D:
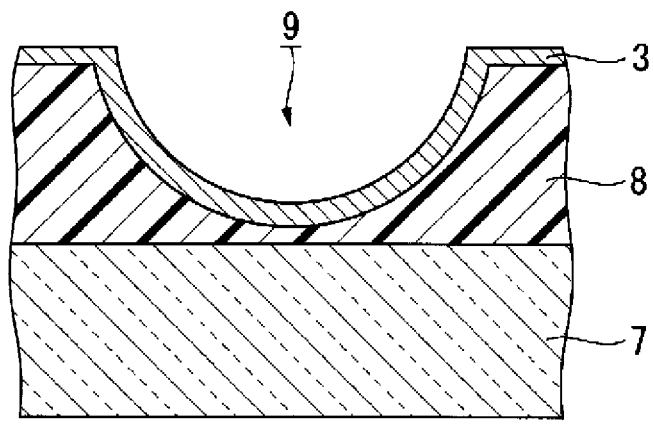
FIG. 6D is a fourth diagram illustrating a manufacturing process up to the forming a reflective layer.

Next, as illustrated in FIG. 6D, a metal such as aluminum is deposited on the entire surface of the underlayer 8, and the reflective layer 3 is formed.

Next, three methods can be given as examples of methods for forming the filling layer 12.

A description follows regarding these methods for forming the filling layer 12.

First Method for Forming Filling Layer

A first method for forming the filling layer is as follows.

Figure 7A:
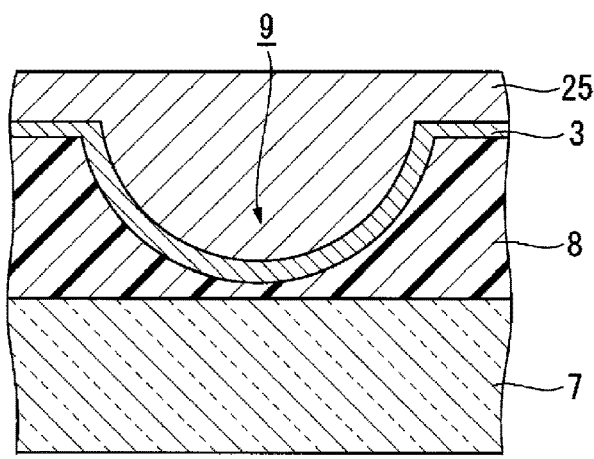
FIG. 7A is a first process diagram illustrating a method of forming a first filling layer.
Figure 7B:
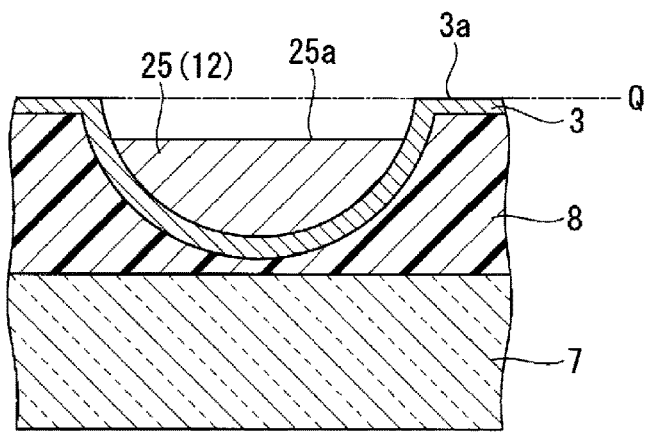
FIG. 7B is a second process diagram illustrating a method of forming the first filling layer.
Figure 7C:
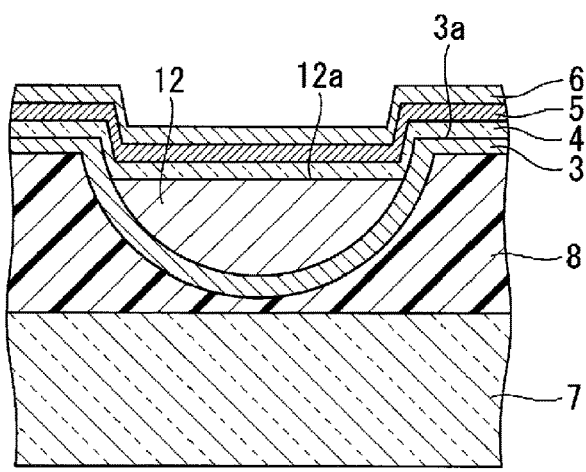
FIG. 7C is a third process diagram illustrating a method of forming the first filling layer.

FIGS. 7A to 7C are process diagrams illustrating a method for forming the first filling layer.

First, as illustrated in FIG. 7A, a resin film 25 formed from acrylic resin, epoxy resin, or polyimide resin is formed on the entire surface of the reflective layer 3. The method for forming the resin film 25 is, for example, applying a liquid resin material onto the reflective layer 3 using a procedure such as spin-coating method or bar-coating method. At this time, the film thickness of the resin film 25 is set so that the resin film 25 fills the recessed portions 9, and also covers flat portions of the reflective layer 3.

Next, as illustrated in FIG. 7B, the entire surface of the resin film 25 is etched back using, for example, a procedure such as plasma ashing (dry ashing). At this time, the etch-back amount is adjusted so that an upper face 25a of the resin film 25 is positioned lower than the plane Q including the upper face 3a of the reflective layer 3. The filling layer 12 is thereby formed.

Next, as illustrated in FIG. 7C, the first electrode 4, the organic layer 5, and the second electrode 6 are sequentially formed on the upper face 3a of the reflective layer 3 and the upper face 12a of the filling layer 12. The first electrode 4, the organic layer 5, and the second electrode 6 are formed by a known process. For example, a pattern may be formed by vacuum deposition using a shadow mask but the method is not limitation thereto; and a spray method, an inkjet method, a printing method, or a laser transfer method may be employed.

Second Method for Forming Filling Layer

A second method for forming the filling layer is as follows.

FIGS. 8A to 8D are process diagrams illustrating a method for forming the second filling layer.

Figure 8A:
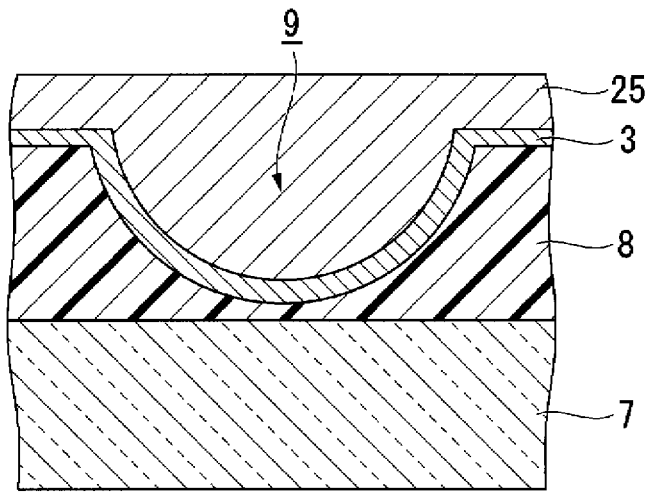
FIG. 8A is a first process diagram illustrating a method of forming a second filling layer.

As illustrated in FIG. 8A, the resin film 25 formed from acrylic resin, epoxy resin, or polyimide resin is formed on the entire surface of the reflective layer 3. This process is the same as that of the first method for forming the filling layer illustrated in FIG. 7A.

Figure 8B:
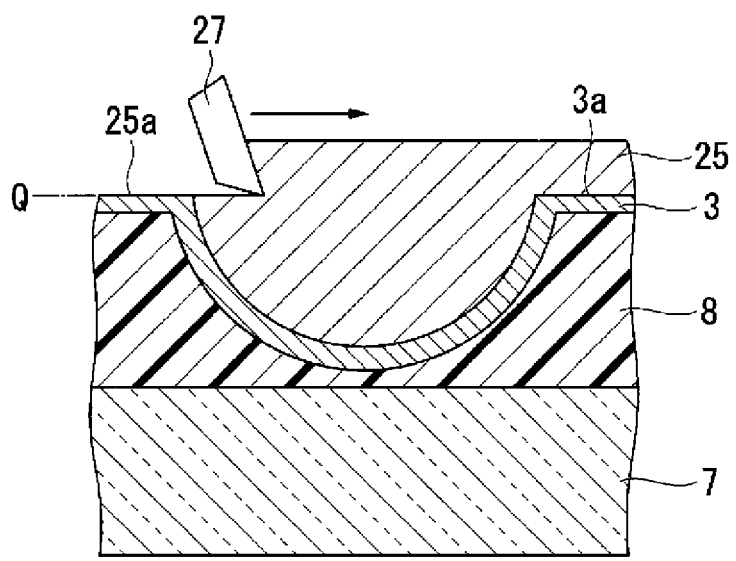
FIG. 8B is a second process diagram illustrating a method of forming the second filling layer.

Next, as illustrated in FIG. 8B, the entire surface of the resin film 25 is leveled using a squeegee 27. At this time, the squeegee 27 is moved along the upper face 3a of the reflective layer 3 so that after the squeegee 27 has passed, the upper face 25a of the resin film 25 is in the same plane as the plane Q including the upper face 3a of the reflective layer 3.

Figure 8C:
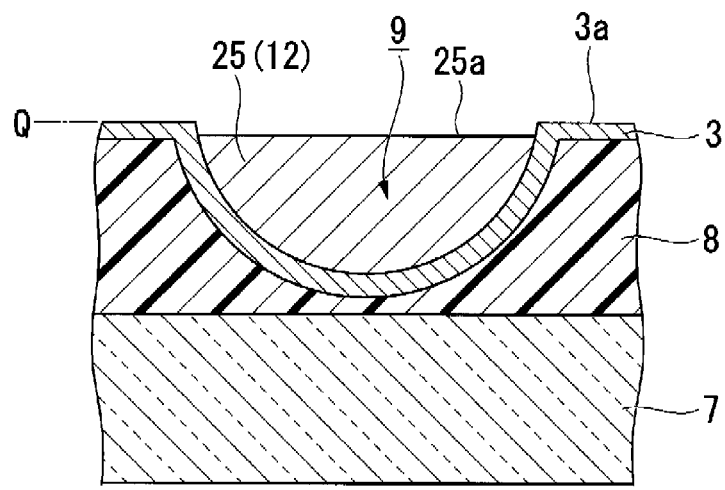
FIG. 8C is a third process diagram illustrating a method of forming the second filling layer.

Next, as illustrated in FIG. 8C, the base material is baked with the resin film 25 remaining in the recessed portions 9.

The volume of the resin film 25 shrinks due to baking, and as a result, the upper face 25a of the resin film 25 is positioned lower than the plane Q including the upper face 3a of the reflective layer 3. The filling layer 12 is thereby formed.

The filling layer 12 can be formed by a method other than the forming methods described above, that includes exposing of the resin film 25 using a photomask, then developing, water-washing, and drying the resin film 25. The photomask has a pattern in which a region corresponding to the recessed portions 9 is shaded. Therefore, during exposure, the acrylic resin layer within the recessed portions 9 is highly exposed by collection of light in the recessed portions 9. This can prevent excess development of the filling layer. As the photomask, for example, a halftone mask may be used.

Figure 8D:
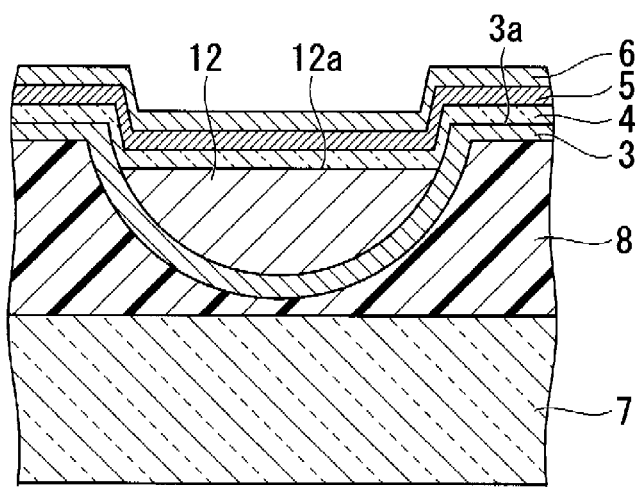
FIG. 8D is a fourth process diagram illustrating a method of forming the second filling layer.

Next, as illustrated in FIG. 8D, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 7C.

Third Method for Forming Filling layer

A third method for forming the filling layer is as follows.

Figure 9A:
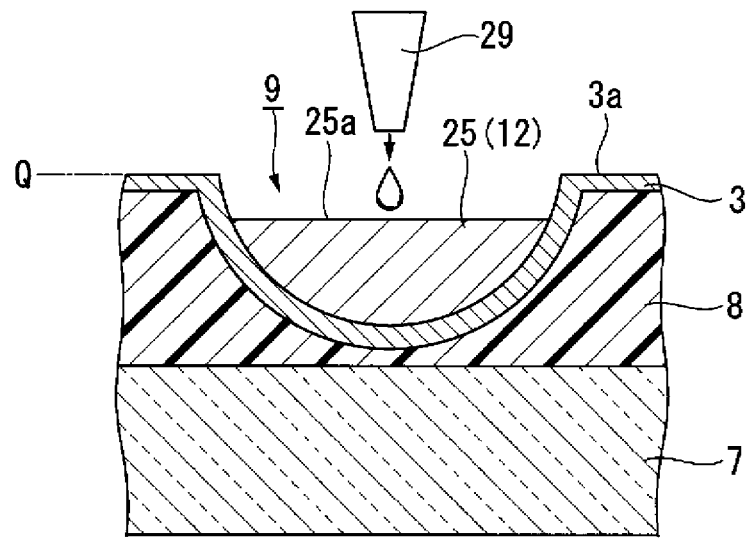
FIG. 9A is a first process diagram illustrating a method of forming a third filling layer.
Figure 9B:
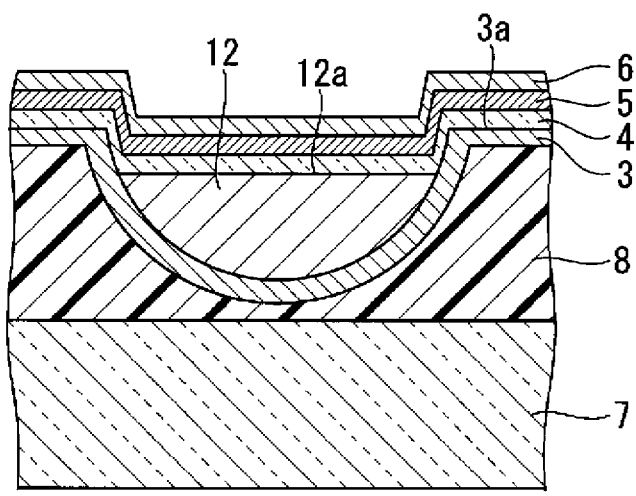
FIG. 9B is a second process diagram illustrating a method of forming the third filling layer.

FIGS. 9A and 9B are process diagrams illustrating the third method for forming the filling layer.

As illustrated in FIG. 9A, the resin film 25 formed from acrylic resin, epoxy resin, or polyimide resin is layered onto the surface of the reflective layer 3 at the inside of the recessed portions 9. As the method for forming the resin film 25, for example, a resin material is applied onto the reflective layer 3 in a liquid drop state using a procedure such as ink jetting. At this time, the amount of resin material ejected from an inkjet head 29 is adjusted so that the upper face 25a of the resin film 25 is positioned lower than the plane Q including the upper face 3a of the reflective layer 3. The filling layer 12 is thereby formed.

Next, as illustrated in FIG. 9B, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 7C.

The organic EL device 1 of the present embodiment is completed by the process above.

Figure 10A:
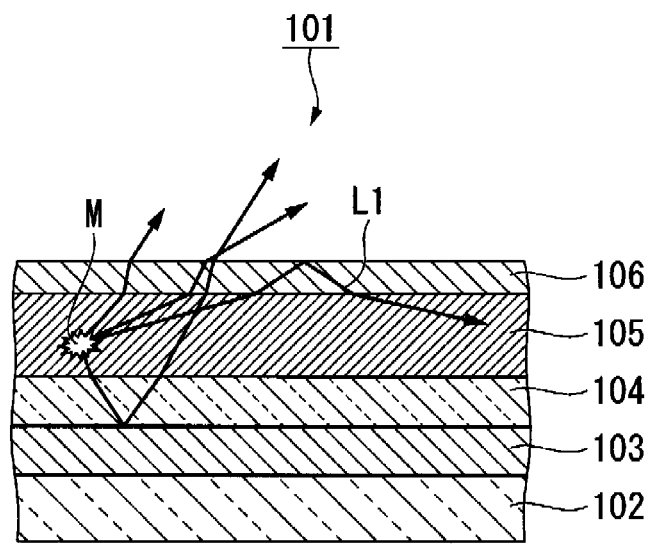
FIG. 10A is a cross-sectional view illustrating a known organic EL device.

FIG. 10A is a cross-sectional view illustrating the known organic EL device 101.

The organic EL device 101 has a configuration in which a reflective layer 103, a first electrode 104, an organic layer 105, and a second electrode 106 are sequentially layered onto a substrate 102. In the organic EL device 101, light emitted from the light emitting layer in the organic layer 105 is emitted uniformly in all directions, and advances through the interior while being refracted by interfaces between respective layers having different refractive indexes. Light that has advanced toward the substrate 102 side is reflected by the reflective layer 103.

Since there is a difference in refractive index at the interface between the second electrode 106 and the external space (air), light incident on this interface at a small angle of incidence is emitted to the external space, and light incident at a large angle of incidence is reflected by this interface and advances though the interior again. For example, light L1 emitted from any light-emission point M in the organic layer 105 in a direction close to a horizontal direction is not easily emitted to the external space even when the angle is somewhat changed by refraction by an inter-layer interface.

Loss due to reflection of light at the interface between the second electrode 106 and the external space (air) does not occur on the path of light advancing through the interior of the organic EL device 101. In contrast thereto, since the reflectivity of metals constituting the reflective layer 103 is generally not 100%, loss due to reflection of light occurs at the interface between the first electrode 104 and the reflective layer 103. Moreover, some of the light is absorbed into respective films while advancing through the interior of the organic EL device 101. Accordingly, the light is attenuated while advancing through the interior of the organic EL device 101. Ordinarily, the refractive index of the organic layer 105 is approximately 1.8. In this case, of the light emitted from the light emitting layer, the proportion of light extracted to the external space is approximately 20%. Thus, the organic EL device 101 in the related art has a problem of low light utilization efficiency.

Figure 10B:
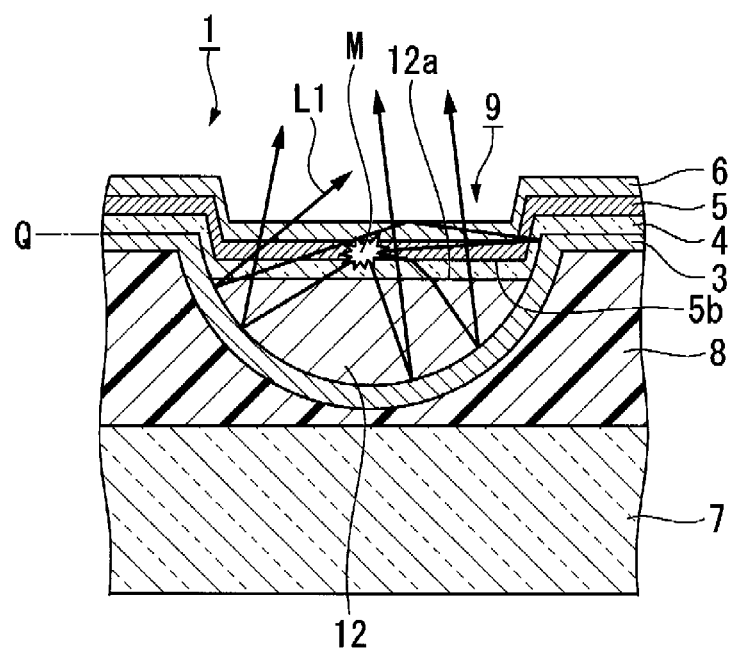
FIG. 10B is a cross-sectional view illustrating an organic EL device according to the present embodiment.

In contrast thereto, in the organic EL device 1 of the present embodiment, as illustrated in FIG. 10B, the advance direction of light reflected by the reflective layer 3 changes because the reflective layer 3 is curved along the recessed portion 9, and the light advances through the interior of the organic EL device 1. At this time, due to reflection by the reflective layer 3, light originally having a large angle of incidence at the interface between the second electrode 6 and the external space (air) is converted to have a smaller angle of incidence than a critical angle at the interface between the second electrode 6 and the external space, and is then extracted to the external space.

Particularly, in the case of the present embodiment, as described above, the upper face 12a of the filling layer 12 is positioned lower than the plane Q including the upper face 3a of the reflective layer 3, and a lower face 5b of the organic layer 5 is also positioned lower than the plane Q. Therefore, the reflective layer 3 is present at a side of the organic layer 5 positioned inside each of the recessed portions 9 in crosswise directions in FIG. 10B. Accordingly, for example, the light L1 emitted from any light-emission point M in the organic layer 5 in a direction close to a horizontal direction is reflected by the reflective layer 3 and the angle of the advance direction is changed. Unlike the known organic EL device 101 illustrated in FIG. 10A, even the light L1 emitted from the light-emission point M in the direction close to a horizontal direction is reflected by the reflective layer 3, and then enters the interface between the second electrode 6 and the external space at a smaller angle of incidence than the critical angle. At that time, the light can be extracted to the external space. Thus, the organic EL device 1 having excellent light utilization efficiency can be provided.

Note that in the present embodiment, light emitted in the substantially horizontal direction from the light-emission point M in the organic layer 5 can also be incident on the reflective layer 3 because the upper face 12a of the filling layer 12 is positioned lower than the plane Q and the lower face 5b of the organic layer 5 is also positioned lower than the plane Q. However, in a case where the upper face 12a of the filling layer 12 are on a same plane with the plane Q, the lower face 5b of the organic layer 5 is be positioned higher than the plane Q. In this case, light emitted in the substantially horizontal direction from the light-emission point M in the organic layer 5 does not incident on the reflective layer 3 because the reflective layer 3 is present at the side of the organic layer 5 positioned inside each of the recessed portions 9. However, even in such cases, the proportion of light that is emitted from the light-emission point M inside the organic layer 5 within a predetermined angle range close to the horizontal direction and that is incident on the reflective layer 3 is sufficiently increased as compared to the known organic EL device 101. Accordingly, even in this configuration, an organic EL device having excellent light utilization efficiency can be provided.

Figure 11A:
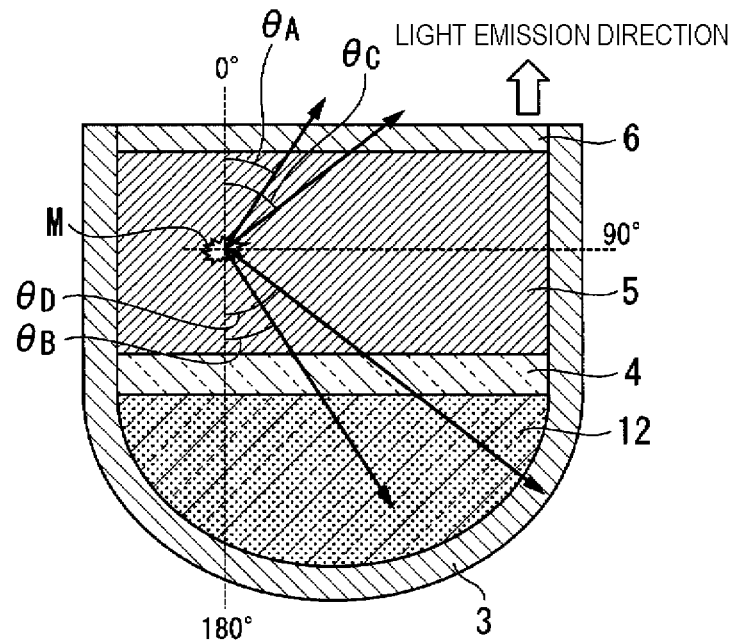
FIG. 11A is a diagram for explaining the light extraction efficiency in an organic EL device according to the first embodiment.
Figure 11B:
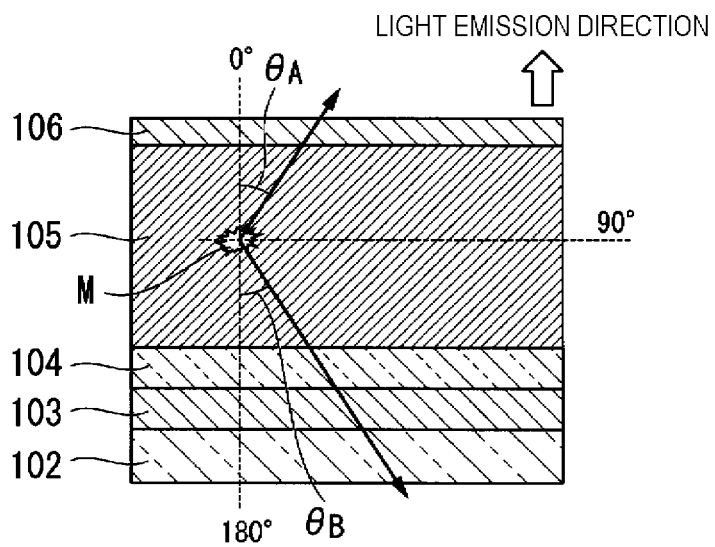
FIG. 11B is a diagram for explaining the light extraction efficiency in a known organic EL device.

FIG. 11A is a schematic structure diagram for explaining the light extraction efficiency in an organic EL device according to the first embodiment. FIG. 11B is a schematic structure diagram for explaining the light extraction efficiency in a known organic EL device. In FIG. 11A and FIG. 11B, the structures are illustrated in a simple manner so as to make the explanation therefor easy to understand.

Herein, the angle of the light that is emitted from the light emitting point M is indicated by the emission angle θ. The emission angle of light that is emitted upward, or outside from the light emitting point M is indicated by θA, θC, and the emission angle of light that is emitted from the light emitting point M to the filling layer 12 side is indicated by θB, θD.

First, the light extraction efficiency of the known organic EL device will be described.

As illustrated in FIG. 11B, in the structure of the known organic EL device, for example, light that is emitted to the outside from the predetermined light emitting point M in the organic layer 105 is composed of a light component that is directly emitted from the upper face of the organic layer 105 in the front direction and a light component that is reflected by the reflective layer 103 and then emitted in the front direction.

The light emission component can be emitted to the outside under the condition of 0°≤θA≤33° and 147°≤θB≤180° when the light emission angle θ in the normal direction of the organic layer 105 is 0°.

The emission angle θA and the emission angle θB are determined under the total reflection condition. Since the refractive index of the organic layer 105 is about 1.8, the emission angle |θA| and the emission angle |θB| are both approximately 33° and the light quantity is 8.5% with respect to the total emitted light. The light component directly emitted from the organic layer 105 in the front direction is the same in light quantity as the light component reflected by the reflective layer 3 and emitted in the front direction, which is approximately 50% of the total emitted light.

Next, the light extraction efficiency of the organic EL device of the present embodiment will be described.

In the organic EL device of the present embodiment, as illustrated in FIG. 11A, the angle of the light emitted in the front direction is increased due to the effect of the recessed structure. Herein, the emission angles |θA| and |θB| are both equal to 33°, the emission angles |θC| and |θD| are both equal to 60°.

The light which is emitted in the front direction is composed of:

(1) The light component which is emitted directly from the light emitting point M in the front direction: the emission angle is in the range of $0°≤|θ|≤33°$, and the light quantity is 8.5% with respect to the total amount of the emitted light;

(2) The light component which is traveling in the front direction from the light emitting point M, and is totally reflected by the second electrode 6, and then emitted in the front direction, changing the angle by the reflection by the reflective layer 3 in the recessed structure: emission angle component is in the range of $33°≤|θ|≤60°$, and the light quantity is 16.5% with respect to the total amount of the emitted light; and (3) The light component which is traveling from the light emitting point M to the recessed structure side that is opposite to the front direction, and then emitted in the front direction, changing the angle by the reflection by the reflective layer 3: the emission angle is in the range of $60°≤|θ|≤180°$, and the light quantity is 25% with respect to the total amount of the emitted light.

Among the light components of the (1), (2), and (3) described above, the light components transmitted through the filling layer 12 correspond to the (2) and (3), and amount to 41.5% with respect to the total amount of the emitted light. The total amount of the extracted light of the (1) to (3) amounts to 50%. Accordingly, the light component of 82% with respect to the total amount of the extracted light is the light which is transmitted through the filling layer 12.

In this way, most of the light emitted from the light emitting layer 16 passes through the filling layer 12 in the recessed structure, and then is reflected by the reflective layer 3 and emitted in the front direction. Thus, the color purity of the emitted light can be effectively enhanced by mixing phosphors of freely selected colors in the filling layer 12 in the recessed structure.

Figure 12A:
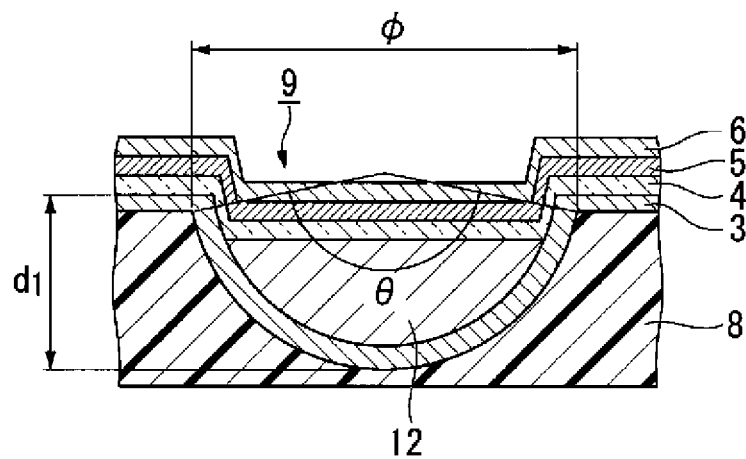
FIG. 12A is a first diagram for explaining a parameter indicative of the depth of a recessed portion.
Figure 12B:
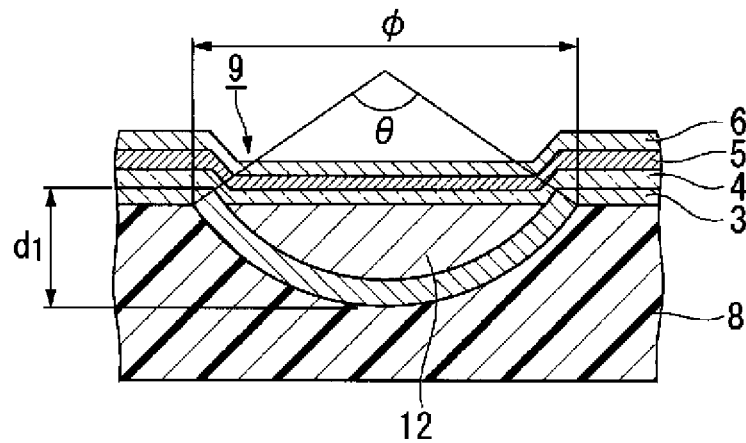
FIG. 12B is a second diagram for explaining a parameter indicative of the depth of the recessed portion.

FIGS. 12A and 12B are diagrams for explaining a parameter of the depth of the recessed portion.

In the present embodiment, as a parameter of depth of the recessed portions 9, a central angle of a circular arc that is the cross-sectional shape of the recessed portions 9 is used.

As illustrated in FIGS. 12A and 12B, the diameter of a circle of the recessed portions 9 as viewed in plan view is made constant, and the cross-sectional shape of the recessed portions 9 is defined as a circular arc. Therefore, the depth d1 of the recessed portions 9 indicates the central angle θ of the circular arc. Accordingly, the deeper the depth d1 of the recessed portions 9, the larger the central angle θ, and the shallower the depth d1 of the recessed portions 9, the smaller the central angle θ.

In the present embodiment, light emitted under an electrical field is UV light or blue light as described above. However, most of light is emitted to the outside through the filling layer 12. Therefore, light emitted to the outside by excitation of a phosphor contained in the filling layer 12 is a light emitting component of the phosphor. In light emission of the phosphor, light is usually emitted uniformly to all directions. However, the light emitting component is not sealed and is guided and emitted to the outside by the recessed portion structure according to one aspect of the disclosure.

To verify the advantageous effects of the organic EL device 1 of the present embodiment, the present inventors produced four pieces of the organic EL devices of the present embodiment (Examples 1 to 4) and measured the light emission efficiency of these.

Next, the light extraction efficiency of the organic EL device of the present embodiment will be described.

Herein, the filling layer was each constituted using phosphors available from BASF Japan Ltd.

Specifically, Lumogen F570 was used for a blue phosphor a, Lumogen F083 was used for a green phosphor b, Lumogen F240 was used for an orange phosphor c, and Lumogen F035 was used for a red phosphor d.

FIGS. 13A, 13B, 13C, and 13D are graphs illustrating a peak wavelengths of an emission spectra in the phosphors a to d. The vertical axis represents Light Transmittance (Absorbance (a.u.)) and Photoluminescence Intensity (a.u.) (PL Intensity), and the horizontal axis represents Wavelength.

Figure 13A:
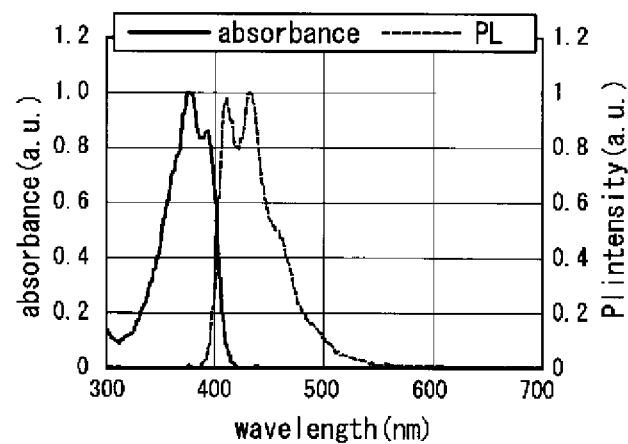

FIG. 13A illustrates an excitation spectrum and emission spectrum in the blue phosphor a.

Figure 13B:
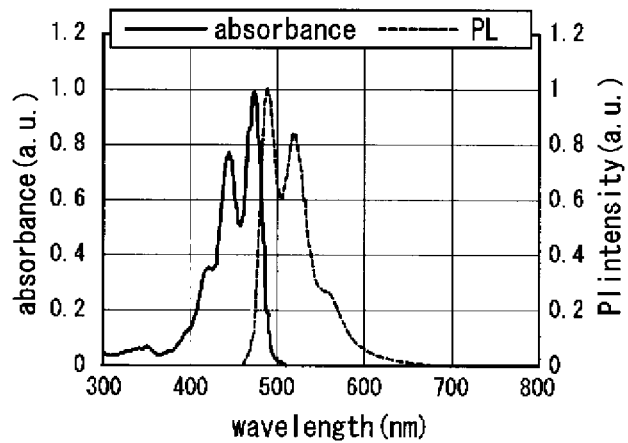
FIG. 13B is a graph illustrating a peak wavelength of an emission spectrum in a phosphor b.

FIG. 13B illustrates an excitation spectrum and emission spectrum in the green phosphor b.

Figure 13C:
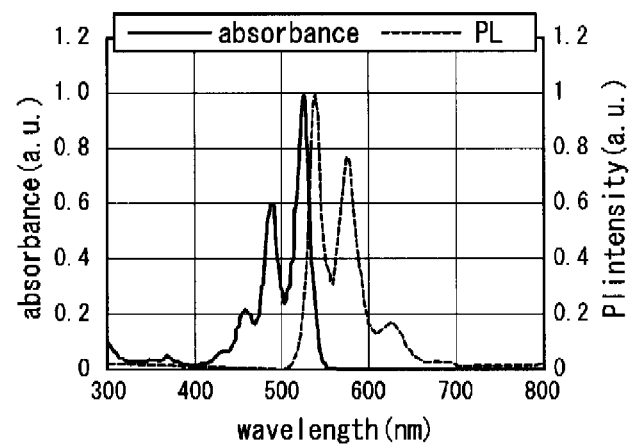
FIG. 13C is a graph illustrating a peak wavelength of an emission spectrum in a phosphor c.

FIG. 13C illustrates an excitation spectrum and emission spectrum in the orange phosphor c.

Figure 13D:
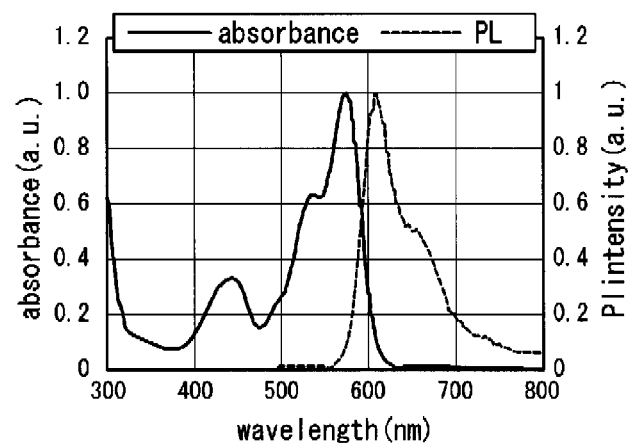
FIG. 13D is a graph illustrating a peak wavelength of an emission spectrum in a phosphor d.

FIG. 13D illustrates an excitation spectrum and emission spectrum in the red phosphor d.

The organic phosphor is characterized in a small difference between the wavelengths of the excitation spectrum which is, as an outline, the absorption spectrum, and the emission spectrum. Basically, the emission spectrum of the excitation light is required to substantially coincide with the absorption spectrum of the phosphor so that the phosphor efficiently emits light by the excitation light.

According to the present embodiment, in the four types of phosphors a, b, c, and d, the absorption spectrums of the phosphors and the emission spectrums of the excited light exhibit small overlaps. Accordingly, even in a case where the luminescent material of the present example and the phosphors a to d are each placed in the filling layer, light is not effectively emitted from the phosphor, but the excitation light itself is emitted to the outside.

A plurality of phosphors can be effectively mixed in order to prevent the above and to obtain desired luminescent colors.

Although a plurality of phosphors are allowed to be uniformly mixed as a procedure for mixing a plurality of phosphors, a color conversion can be effectively carried out by using the mixing method that utilizes "Förster energy mechanism".

Paragraph 0095

FIG. 14 is a table listing the mixing ratio (molar ratio) of various types of phosphor constituting each filling layer in each of the organic EL devices of Examples 1 to 4.

In the filling layer A of the organic EL device of Example 1, the resin as a binder is 97%, and the blue phosphor a is 3%.

In the filling layer B of the organic EL device of Example 2, the resin as a binder is 92%, the blue phosphor a is 5%, and the green phosphor b is 3%.

In the filling layer C of the organic EL device of Example 3, the resin as a binder is 87%, the blue phosphor a is 5%, the green phosphor b is 5%, and the orange phosphor c is 3%.

In the filling layer D of the organic EL device of Example 4, the resin as a binder is 87%, the blue phosphor a is 5%, the green phosphor b is 3%, the orange phosphor c is 3%, and the red phosphor d is 2%.

The phenomenon of color conversion described above causes resonance between the phosphors when the emission spectrum of the phosphor having a short wavelength and the absorption spectrum of the phosphor having a long wavelength in the two types of phosphor coincide with each other.

Accordingly, even in a case where the phosphors are apart from each other in distance of approximately 10 to 20 nm, the energy is transferred to the phosphor having a long wavelength, and thereby, only the phosphor having a long wavelength emits light, and the phosphor having a short wavelength does not emit light.

In other words, the concentration of the phosphor having a short wavelength, by using the phenomenon, can be made lower than that of the phosphor having a long wavelength, and thereby, only the light of long wavelength can be emitted without rendering the light of the phosphor having a short wavelength mixed therein.

In the present embodiment, even when a plurality of light of phosphors are color-mixed on the basis of the above principle, only the phosphor having the longest wavelength can be made emit light.

In the case of Example 2, the blue phosphor a absorbs the light emitted from the light emitting layer, and the energy is transferred to the green phosphor b. Accordingly, only the green phosphor b emits light, and green light is obtained thereby.

In the case of Example 3, the blue phosphor a absorbs the light emitted from the light emitting layer, the energy is transferred to the green phosphor b, and then the energy is further transferred to the orange phosphor c. Accordingly, only the orange phosphor c emits light, and orange light is obtained thereby.

In the case of Example 4, the blue phosphor a absorbs the light emitted from the light emitting layer, the energy is transferred to the green phosphor b, and subsequently, the energy is transferred to the orange phosphor c and is further transferred to the red phosphor d. Accordingly, only the red phosphor d emits light, and red light is obtained thereby.

As described above, although the Stokes shift in the orange phosphor c and the red phosphor d, which is the difference between the maximum excitation wavelength and the maximum fluorescent wavelength in the phosphors, is smaller than that in the blue phosphor a, such a phosphor can emit light of any color.

Figure 15A:
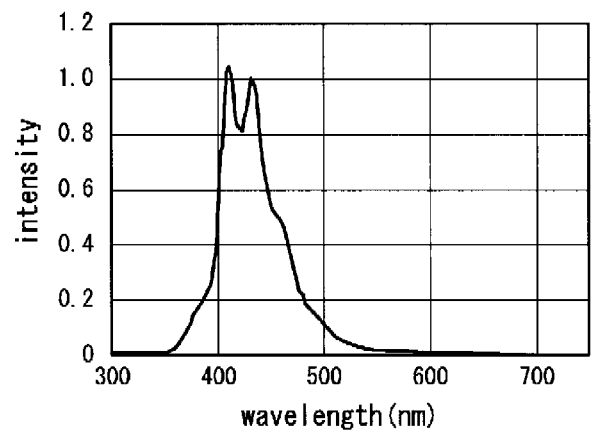
FIG. 15A is a graph illustrating spectral properties of the organic EL device of Example 1.
Figure 15B:
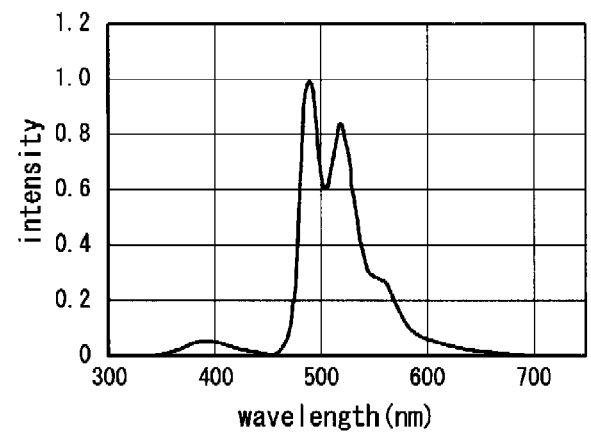
FIG. 15B is a graph illustrating spectral properties of the organic EL device of Example 2.
Figure 15C:
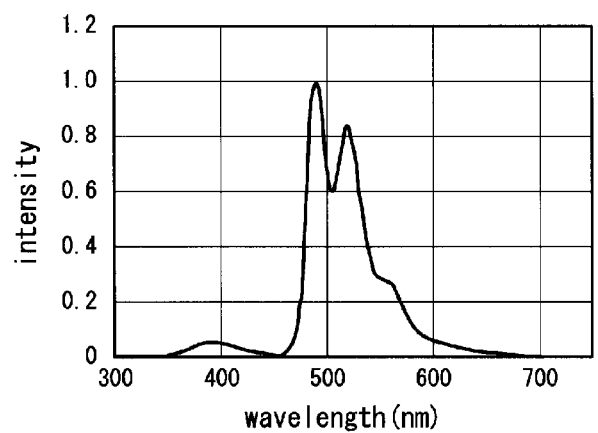
FIG. 15C is a graph illustrating spectral properties of the organic EL device of Example 3.
Figure 15D:
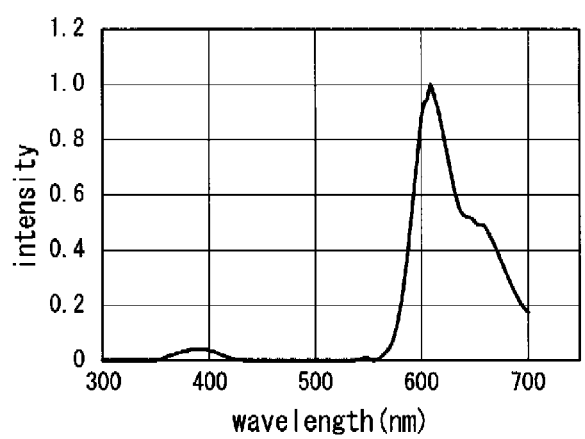
FIG. 15D is a graph illustrating spectral properties of the organic EL device of Example 4.

FIG. 15A, FIG. 15B, FIG. 15C, and FIG. 15D are graphs illustrating the spectral properties of the organic EL devices of Examples 1 to 4. In FIGS. 15A to 15D, FIG. 15A illustrates the device having the filling layer A, FIG. 15B illustrates the device having the filling layer B, FIG. 15C illustrates the device having the filling layer C, and FIG. 15D illustrates the device having the filling layer D.

As illustrated in FIG. 15A, FIG. 15B, FIG. 15C, and FIG. 15D, only the light emission of the longest wavelength among the various types of phosphor included in the filling layers A to D of the organic EL devices was observed.

In Examples 1 to 4, since the filling layers A to D are formed as color-conversion layers, a color filter layer or a color filter substrate is not required to be additionally prepared, and therefore, a color conversion device can be produced in a simple process.

MODIFIED EXAMPLE

In the above-described embodiment, although the phosphors of a plurality of colors are mixed with each other in the filling layer 12 to emit light of the longest wavelength, the light emission wavelength can be altered by appropriately varying the mixing ratio of the phosphor.

For example, when the mixing ratio of the blue phosphor a is tripled in the filling layer of the organic EL device of Example 4, emission spectra of the blue phosphor a and the red phosphor d are observed as apparent white light. In this way, a desired emission color can be obtained by freely adjusting the mixing ratio of the phosphors each having different color.

As described above, according to the present embodiment, a color display is obtained, by mixing phosphors that emit light of any color in the filling layer 12, without providing a color filter layer on the light emitting element, and an organic EL device capable of displaying high-definition images can be provided. Further, the process of forming the color filter layer is unnecessary, thus simplifying the process.

Moreover, the light extraction efficiency is improved to approximately twice as compared to the known structure not having recessed portions due to the effect of the recessed portion 9, and a high-brightness display can be provided.

Second Embodiment

A description follows regarding an organic EL device of a second embodiment of the disclosure.

A basic configuration of the organic EL device of the second embodiment is substantially the same as that of the first embodiment except that an ultraviolet light absorbing layer is provided on the second electrode. The light emitting layer emits ultraviolet light.

Figure 16:
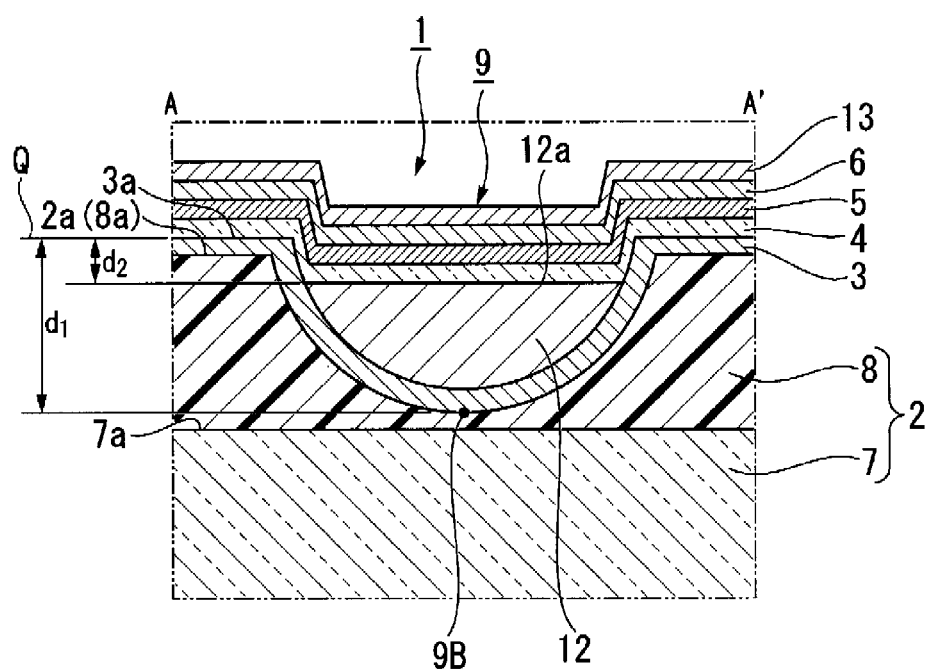
FIG. 16 is a cross-sectional view illustrating an essential part of an organic EL device according to a second embodiment.

FIG. 16 is a cross-sectional view illustrating an essential part of an organic EL device according to the second embodiment.

As illustrated in FIG. 16, in the organic EL device of the present embodiment, the ultraviolet absorbing layer 13 is provided on the second electrode 6. The ultraviolet absorbing layer 13 absorbs invisible light of 10 nm to 400 nm.

The ultraviolet absorbing layer 13 in a form of a sheet is adhered onto the surface of the second electrode 6. In addition to the above-described procedure, the ultraviolet absorbing layer 13 may be provided thereon such that, for example, the ultraviolet absorbing layer 13 may be directly coated as a film on the second electrode 6, or may be formed using vapor deposition.

According to the configuration of the present embodiment, the color purity can be further enhanced by absorbing in the ultraviolet absorbing layer 13 the light component that is directly emitted upward from the light emitting layer among the light components that are emitted from the organic EL device. Although the light component is only slightly emitted upward from the light emitting layer, the ultraviolet absorbing layer 13 may be provided in the case where high color purity is required.

Figure 17A:
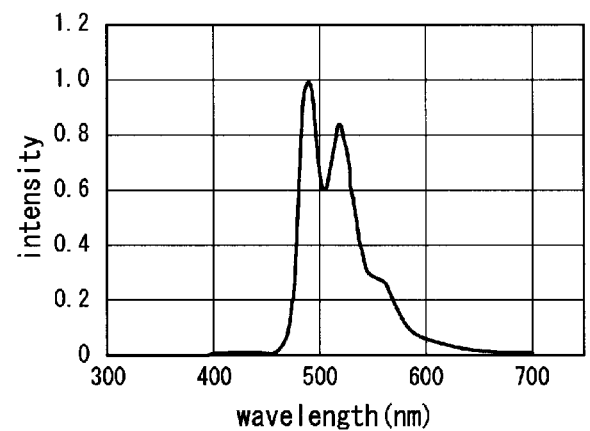
FIG. 17A is a graph illustrating a spectrum of an organic EL device having an ultraviolet absorbing layer.
Figure 17B:
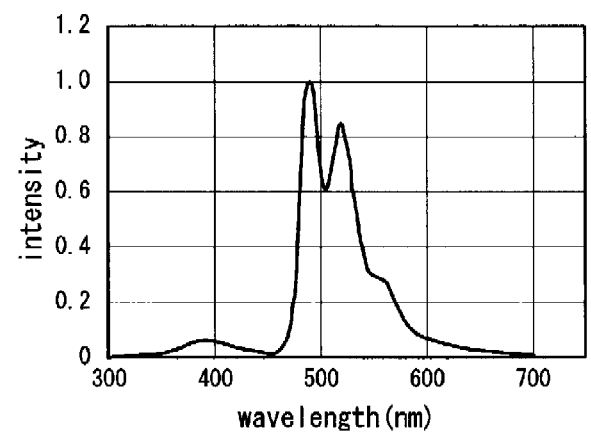
FIG. 17B is a graph illustrating a spectrum of an organic EL device not provided with an ultraviolet absorbing layer.

FIG. 17A is a graph illustrating a spectrum of an organic EL device having an ultraviolet absorbing layer, and FIG. 17B is a graph illustrating a spectrum of an organic EL device not having an ultraviolet absorbing layer. Herein, an organic EL device having a filling layer composed of 92% of resin, 5% of blue phosphor a, and 3% of green phosphor b is employed in accordance with the device structure of Example 2 described above.

As illustrated in FIG. 17B, an organic EL device not having the ultraviolet absorbing layer exhibits an emission peak at 380 nm, and the emission spectrum is slightly observed in the light emitting layer.

In contrast thereto, as illustrated in FIG. 17A, it is observed that the organic EL device having the ultraviolet absorbing layer no longer exhibit the emission spectrum of the light emitting layer, the spectrum of phosphor having the longest wavelength in the filling layer is only present, and thereby, the chromaticity is enhanced.

Third Embodiment

A description follows regarding the organic EL device of the third embodiment of the disclosure.

A basic configuration of the organic EL device of the third embodiment as described later is substantially the same as that of the first embodiment except that an inorganic phosphor is employed as the phosphor.

The organic EL device of the present embodiment has a filling layer composed of resin material and inorganic phosphor.

The content ratio of the inorganic phosphor in the filling layer is in the range of 10 to 50%, and the content ratio is set to 30% in the present embodiment. Examples of inorganic phosphors include halophosphate phosphors, phosphate phosphors, and silicate phosphors, and are not limited thereto.

Examples of the blue inorganic phosphor include halophosphate phosphors such as $(Sr,Ca)_{10}(PO_4)_6Cl_2:Eu^{2+}$, $(Sr,Ca)_{10}(PO_4)_6Cl_2.nB_2O_2:Eu^{2+}$. Examples of green inorganic phosphors include phosphate phosphors such as $LaPO_4:Ce^{2+}, Tb^{2+}$, $La_2O_3.0.2SiO_2.0.9P_2O_3:Ce^{3+}, Yb^{3+}$, and silicate phosphors such as $Zn_2SiO_2:Mn^{2+}$. Examples of the red inorganic phosphor include $Y_2O_3:Eu^{3+}$, and $6MgO.As_2O_5:Mn^{4+}$.

Specifically, in the present embodiment, "β-sialon:$Eu^{2+}$" is used for the inorganic phosphor as a green light emitting filling layer E. In addition, "$CaAlSiN_3:Ce^{3+}$" is used for the inorganic phosphor as a red light emitting filling layer F.

Figure 18A:
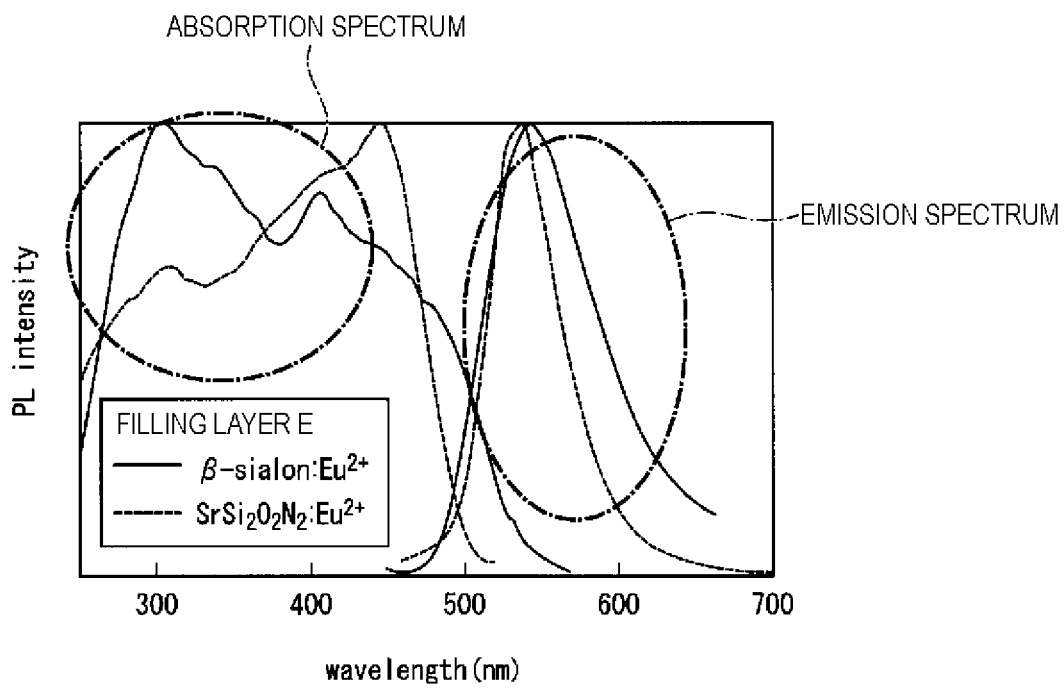
FIG. 18A is a graph illustrating an emission spectrum and an absorption spectrum of a green light emitting filling layer E.
Figure 18B:
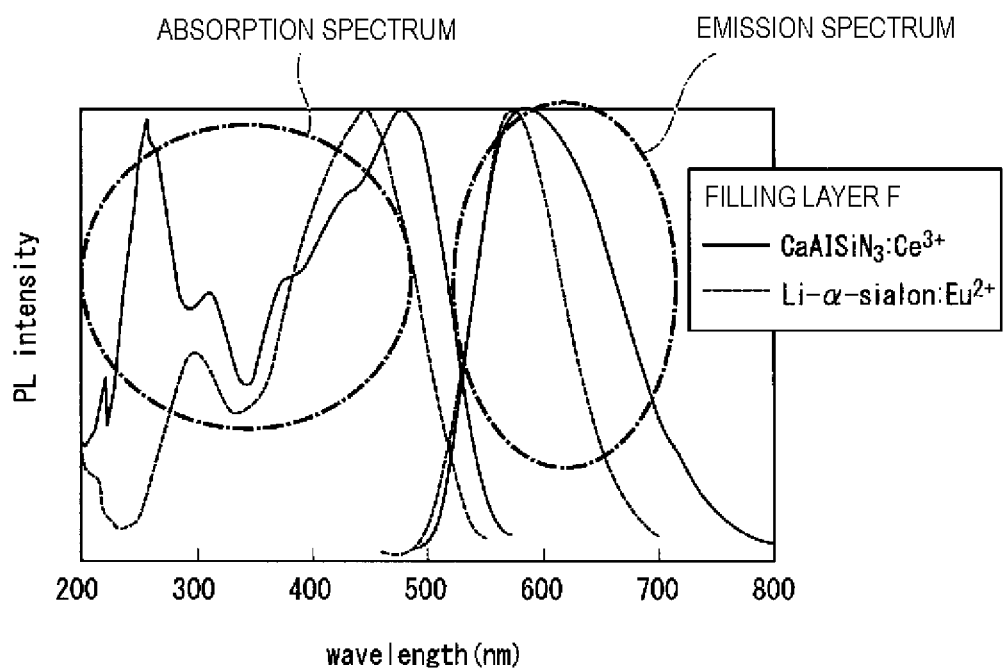
FIG. 18B is a graph illustrating an emission spectrum and an absorption spectrum of a red light emitting filling layer F.

FIG. 18A is a graph illustrating an emission spectrum and an absorption spectrum of the green light emitting filling layer E, and FIG. 18B is a graph illustrating an emission spectrum and an absorption spectrum of the red light emitting filling layer F. In FIG. 18A and FIG. 18B, each of the emission spectrum and the absorption spectrum is surrounded by a dashed line.

As illustrated in FIGS. 18A and 18B, in each of the organic EL devices having the filling layer E, a green light emission of the inorganic phosphor that is mixed in the filling layer E is observed, and in each of the organic EL devices having the filling layer F, a red light emission of the inorganic phosphor that is mixed in the filling layer F is observed.

In the inorganic phosphor, the absorption band extends from the UV region to the vicinity of the emission spectrum, and green emission and red emission can be obtained even only from UV (Deep Blue). In other words, a plurality of types of organic phosphors are not required to be mixed therein unlike the first embodiment described above.

Further, the inorganic phosphor itself has a large particle size and scatters the light emitting component. Because of this, the light extraction effect to the outside can be enhanced. In this way, the inorganic phosphor is mixed into the resin material constituting the filling layer so that the light utilization efficiency at constant current is enhanced by approximately 10%.

Fourth Embodiment

A description follows regarding an organic EL device of the fourth embodiment of the disclosure.

A basic configuration of the organic EL device of the fourth embodiment is substantially the same as that of the first embodiment except that a quantum dot is used as phosphor.

Quantum dot is a metal compound, or a cluster semiconductor composed of several tens of atoms with a diameter of several nm, and has specific light absorption and fluorescence. The wavelength of the quantum dot varies depending on a size of the particle so that various colors can be obtained by varying the size.

Herein, the quantum dot of CdSe/ZnS core-shell type available from Sigma-Aldrich Corporation is employed. This phosphor has a structure in which the ZnS is provided at the outside of the CdSe as a core and an organic ligand is provided on the outer periphery thereof. The emission color is determined in accordance with the size of the Cd/Se.

In the present embodiment, a phosphor having a diameter of 3.0 nm and an emission peak of 530 nm is employed, and 3% of the phosphor is mixed in a binder to form a filling layer G.

In the quantum dot, the absorption band extends from the UV region to the vicinity of the emission spectrum, and a green light emission and a red light emission can be obtained only from UV (Deep Blue). Because of this, a plurality of types of phosphors are not required to be mixed therein unlike the first embodiment. Further, the quantum dot can be smoothly dissolved in a binder by introducing organic ligands thereto. As the result thereof, the inside of the filling layer is made uniform, and thus light emission without unevenness can be obtained. Moreover, the effect that the emission spectrum is made steep and the color purity is made high, is also obtained.

In the organic EL device having the filling layer G of the present embodiment, a light emission of quantum dot is observed. The spectrum of quantum dot has a peak wavelength of 530 nm, a half-value width of 30 nm, and chromaticity (0.20, 0.71). Accordingly, a green light emitting element having high color purity was able to be produced.

Fifth Embodiment

A description follows regarding an organic EL device of a fifth embodiment of the disclosure.

A basic configuration of the organic EL device of the fifth embodiment as described later is substantially the same as that of the first embodiment except that three sub-pixels compose one pixel.

Figure 19:
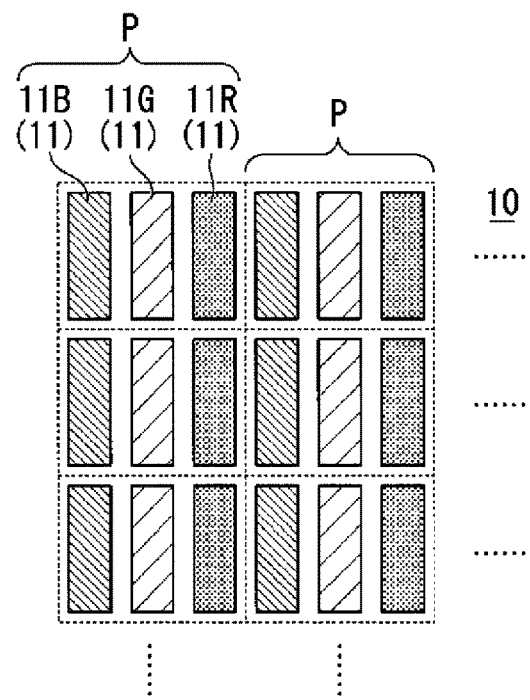
FIG. 19 is a plan view illustrating a portion of a display region in an organic EL device according to a fifth embodiment.

FIG. 19 is a plan view illustrating a portion of a display region in an organic EL device according to the fifth embodiment.

As illustrated in FIG. 19, an organic EL device of the present embodiment is a display device having a display region 10 in which a plurality of pixels Ps are arranged in a matrix. The pixels Ps each include three sub pixels 11 of RGB arranged in turn in a crosswise direction of the display region 10. A red sub pixel 11R emits red light, a green sub pixel 11G emits green light, and a blue sub pixel 11B emits blue light. The fluorescent materials included in the filling layers of the red sub pixel 11R, the green sub pixel 11G, and the blue sub pixel 11B differ from one another, and the other configurations are common. The size of the sub pixel 11 is 200 nm in length and 100 nm in width.

Each of the red sub pixel 11R, the green sub pixel 11G, and the blue sub pixel 11B can be independently driven (application of electrical field). As a procedure for independently applying a voltage to the sub pixels, any procedure using a simple matrix electrode, segment division, or an SW substrate such as a TFT can be performed.

In the present embodiment, since one pixel is divided into three sub pixels 11, and each of the sub pixels 11 is independently driven and includes a filling layer having different fluorescent materials, any color can be displayed according to how light is emitted in each of the sub pixels 11.

Figure 20:
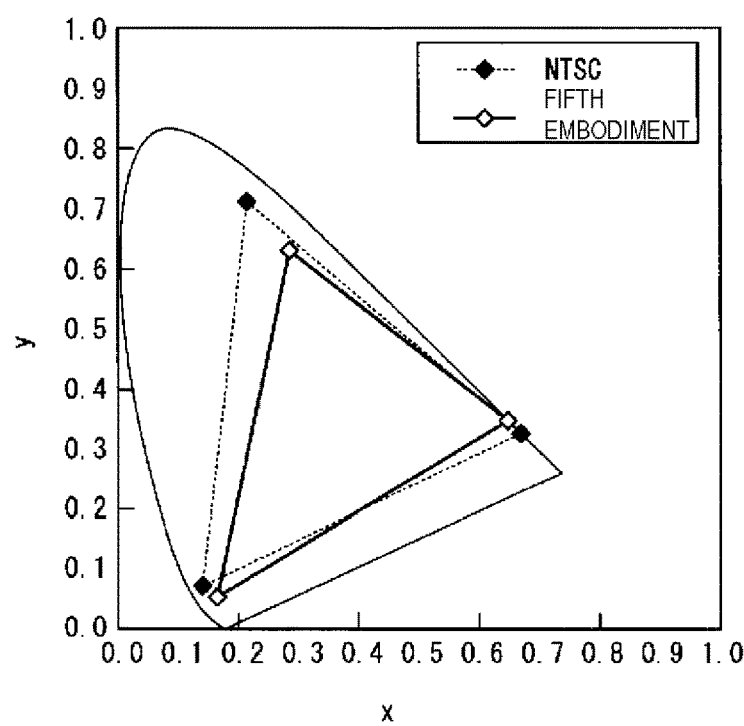
FIG. 20 is a diagram illustrating the chromaticity of a RGB sub pixel in the fifth embodiment.

FIG. 20 is a diagram illustrating the chromaticity of the RGB sub pixel in the fifth embodiment.

As illustrated in FIG. 20, the color gamut standardized by NTSC is indicated by a broken triangle on the xy chromaticity diagram. When the organic EL device of the present embodiment is caused to emit light, the chromaticity of each sub pixel is the chromaticity indicated by the solid triangle on the xy chromaticity diagram. According to the configuration of the present embodiment, a color display is obtained, in which the intermediate color degree in the RGB chromaticity range can be optionally varied.

Sixth Embodiment

A description follows regarding an organic EL device of a sixth embodiment of the disclosure.

The basic configuration of the organic EL device of the sixth embodiment is substantially the same as that of the first embodiment except that one of the three sub pixels that compose one pixel is a transparent sub pixel. In the transparent sub pixel, the fluorescent material of the filling layer is not employed.

Figures 21, 22:
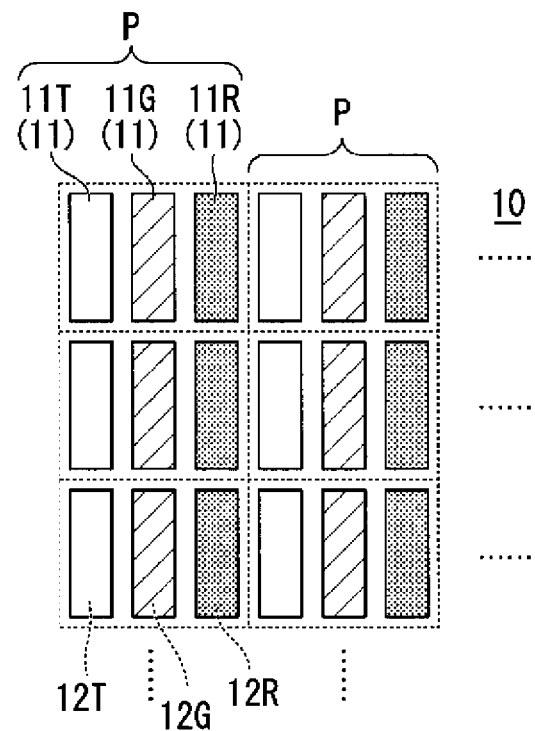
FIG. 21 is a plan view illustrating a portion of a display region in an organic EL device according to a six embodiment.
FIG. 22 is a chromaticity diagram illustrating an organic EL device according to the sixth embodiment.

FIG. 21 is a plan view illustrating a portion of a display region in an organic EL device according to the sixth embodiment.

In the organic EL device of the present embodiment, as illustrated in FIG. 21, one pixel P is composed of three sub pixels 11 including a sub pixel 11T, the sub pixel 11G, and the sub pixel 11R. The sub pixel 11G and the sub pixel 11R in these three sub pixels 11 have filling layers (first filling layers) 12G and 12R including phosphors, while the sub pixel 11T includes a phosphor-free filling layer (second filling layer) 12T.

The sub pixel 11T which is transparent, is a blue light emitting element having peak at 450 nm of the emission spectrum of the light emitting material in the light emitting layer. Because of this, the color conversion does not need to be performed in the sub pixel 11T, and thus, the phosphor is not mixed in the filling layer. In addition, in the sub pixels 11R and 11G, the colors can be converted into green and red by the emission of blue light.

The efficiency of color conversion is not necessarily 100% and a loss occurs to some extent. In the present embodiment, the blue light is directly emitted from the sub pixel 11T, and thereby, the efficiency can be enhanced without the conversion loss being occurred.

FIG. 22 is the chromaticity diagram of an organic EL device according to the sixth embodiment.

When the organic EL device of the present embodiment is caused to emit light, the chromaticity coordinate of each sub pixel 11 is as illustrated in FIG. 22. This device is a color display device capable of optionally varying the chromaticity within each of the chromaticity ranges.

Seventh Embodiment

A description follows regarding an organic EL device of a seventh embodiment of the disclosure.

A basic configuration of the organic EL device of the present embodiment as described later is substantially the same as that of the sixth embodiment except that a blue absorbing layer is provided therewith. The light emitting layer emits blue light.

According to the organic EL device of the present embodiment, in the display region including three sub pixels 11 of RGT, a blue absorbing layer (light absorbing layer) is provided on the second electrode 6. The blue absorbing layer corresponds to the light absorbing layer of one embodiment of the disclosure and absorbs light of 400 nm to 500 nm.

For the light absorbing layer, a material is used, in which the absorption wavelength substantially coincides with the emission spectrum of the light emitting layer.

Although the blue absorbing layer is provided by attaching a sheet-like material directly on the second electrode 6, the method for providing the blue absorbing layer is not limited thereto. In addition to the above-described method, the blue absorbing layer may be provided thereon such that, for example, the blue absorbing layer may be directly coated as a film on the second electrode 6, or may be formed using vapor deposition.

According to the configuration of the present embodiment, the color purity can be further enhanced by absorbing, in the blue absorbing layer, the blue light component that is directly emitted upward from the light emitting layer, among the light components emitted from the organic EL light emitting element of the sixth embodiment. Although the light component is only slightly directly emitted upward from the light emitting layer, the blue absorbing layer may be provided in the case where high color purity is required.

Figure 23A:
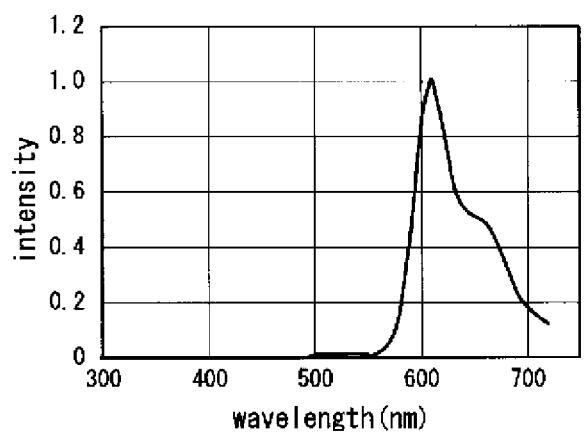
FIG. 23A is a graph illustrating a spectrum of an organic EL device having a blue absorbing layer.
Figure 23B:
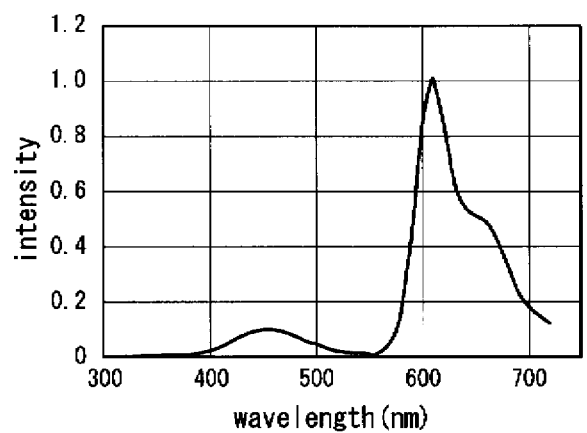
FIG. 23B is a graph illustrating a spectrum of an organic EL device not having a blue absorbing layer.

FIG. 23A illustrates a spectrum of an organic EL device having a blue absorbing layer, and FIG. 23B is a graph illustrating a spectrum of an organic EL device not having a blue absorbing layer. Herein, an organic EL device having the device structure of the sixth embodiment above described and having three sub pixels of RGT per one pixel is employed. Herein, the emission spectrum of the red sub pixel 11R is illustrated.

As illustrated in FIG. 23B, in an organic EL device not having a blue absorbing layer, an emission spectrum in a light emitting layer having an emission peak at 450 nm is slightly observed.

In contrast thereto, as illustrated in FIG. 23A, it is observed that the organic EL device including the blue absorbing layer no longer exhibit the emission spectrum of the light emitting layer, the spectrum of red phosphor having the longest wavelength in the filling layer is only present, and thereby, the chromaticity of red is enhanced.

Note that the technical scope of the disclosure should not be limited to the above embodiments, and various modifications can be made without departing from the gist of the disclosure.

Although a description has been given in the embodiments above regarding examples of cases in which the cross-sectional profile of the recessed portion is a circular arc, the cross-sectional profile of the recessed portion need not be a circular arc. The cross-sectional shape of the recessed portions may include, for example, an ellipse or any curved line, or may partially include a straight line.

In addition, specific configuration such as the shape, dimensions, number, disposition, configuration materials, and forming processes of each portion of the organic EL device are not limited to the embodiments above, and may be appropriately modified.

INDUSTRIAL APPLICABILITY

Several embodiments of the disclosure can be applied to any electronic device having a light emitting portion, such as a display device or an illumination device.

REFERENCE SIGNS LIST

2 Base material
3 Reflective layer
4 First electrode
5 Organic layer
5b Lower face
6 Second electrode
9 Recessed portion
a, b, c, d Phosphor
A, B, C, D, E, F, G, 12 Filling layer
12G, 12R First filling layer
12T Second filling layer
Q Plane
13 Ultraviolet absorbing layer
16 Light emitting layer

The invention claimed is:

1. An organic electroluminescence device comprising:
a base material including a recessed portion on a surface side;
a reflective layer;
a filling layer having optical transparency;
a first electrode having optical transparency;
an organic layer including at least a light emitting layer; and
a second electrode having optical transparency and light reflectivity,
the reflective layer being disposed at least along a surface of the recessed portion, the filling layer being disposed in the recessed portion through the reflective layer, the first electrode being disposed at least on an upper-layer side of the filling layer, the organic layer being disposed on an upper-layer side of the first electrode, and the second electrode being disposed on an upper-layer side of the organic layer, wherein
the filling layer includes at least one type of phosphor, and
a lower face of the first electrode at a position inside the recessed portion is positioned lower than a plane including the surface side of the base material.

2. The organic electroluminescence device according to claim 1, wherein the filling layer includes at least two different types of the phosphor.

3. The organic electroluminescence device according to claim 1, wherein a portion of the reflective layer is in contact with a portion of the first electrode.

4. The organic electroluminescence device according to claim 1, wherein a fluorescent wavelength of the at least one type of the phosphor included in the filling layer differs from a light emission wavelength of a light emitting material included in the light emitting layer.

5. The organic electroluminescence device according to claim 1, wherein a fluorescent wavelength of at the least one type of the phosphor included in the filling layer is longer than a light emission wavelength of a light emitting material included in the light emitting layer.

6. The organic electroluminescence device according to claim 1, wherein the at least one type of the phosphor includes a plurality of phosphors having different fluorescent wavelengths.

7. The organic electroluminescence device according to claim 1, wherein a fluorescent wavelength of at the least one type of the phosphor included in the filling layer is in an ultraviolet region.

8. The organic electroluminescence device according to claim 1, wherein the at least one type of the phosphor includes an organic material.

9. The organic electroluminescence device according to claim 1, further comprising an ultraviolet absorbing layer on an upper face of the light emitting layer.

10. The organic electroluminescence device according to claim 1, wherein the at least one type of the phosphor included in the filling layer includes an inorganic material.

11. The organic electroluminescence device according to claim 1, wherein the at least one type of the phosphor included in the filling layer includes a quantum dot.

12. The organic electroluminescence device according to claim 1, wherein the filling layer includes at least two types of filling layer including the mutually different types of the phosphor.

13. The organic electroluminescence device according to claim 1, wherein one pixel includes a first sub pixel having a first filling layer including the at least one type of the phosphor and a second sub pixel including a second filling layer not including the at least one type of the phosphor.

14. The organic electroluminescence device according to claim 1, further comprising a light absorbing layer configured to absorb light of a specific wavelength on an upper face of the light emitting layer.

15. The organic electroluminescence device according to claim 14, wherein an absorption wavelength of the light absorbing layer substantially coincides with a spectrum emitted from the light emitting layer.

16. An organic electroluminescence device comprising:
a base material including a recessed portion on a surface side;
a reflective layer;
a filling layer having optical transparency;
a first electrode having optical transparency;
an organic layer including at least a light emitting layer; and
a second electrode having optical transparency and light reflectivity,
the reflective layer being disposed at least along a surface of the recessed portion, the filling layer being disposed in the recessed portion through the reflective layer, the first electrode being disposed at least on an upper-layer side of the filling layer, the organic layer being disposed on an upper-layer side of the first electrode, and the second electrode being disposed on an upper-layer side of the organic layer, wherein
the filling layer includes at least two different types of phosphor.

17. The organic electroluminescence device according to claim 16, wherein a portion of the reflective layer is in contact with a portion of the first electrode.

18. The organic electroluminescence device according to claim 16, wherein a fluorescent wavelength of the at least one type of the phosphor included in the filling layer differs from a light emission wavelength of a light emitting material included in the light emitting layer.

19. The organic electroluminescence device according to claim 16, wherein a fluorescent wavelength of the at least one type of the phosphor included in the filling layer is longer than a light emission wavelength of a light emitting material included in the light emitting layer.

20. An organic electroluminescence device comprising:
a base material including a recessed portion on a surface side;
a reflective layer;
a filling layer having optical transparency;
a first electrode having optical transparency;
an organic layer including at least a light emitting layer; and a second electrode having optical transparency and light reflectivity, the reflective layer being disposed at least along a surface of the recessed portion, the filling layer being disposed in the recessed portion through the reflective layer, the first electrode being disposed at least on an upper-layer side of the filling layer, the organic layer being disposed on an upper-layer side of the first electrode, and the second electrode being disposed on an upper-layer side of the organic layer, wherein the filling layer includes at least one type of phosphor, and the at least one type of the phosphor included in the filling layer includes an inorganic material.

\* \* \* \* \*